United States Patent
Ono et al.

(10) Patent No.: US 9,054,093 B2
(45) Date of Patent: Jun. 9, 2015

(54) SEMICONDUCTOR DEVICE

(71) Applicant: Renesas Electronics Corporation, Kawasaki-shi, Kanagawa (JP)

(72) Inventors: Yoshihiro Ono, Kanagawa (JP); Tsuyoshi Kida, Kanagawa (JP); Kenji Sakata, Kanagawa (JP)

(73) Assignee: Renesas Electronics Corporation, Kawasaki-shi (JP)

(*) Notice: Subject to any disclaimer, the term of this patent is extended or adjusted under 35 U.S.C. 154(b) by 0 days.

(21) Appl. No.: 14/287,023

(22) Filed: May 24, 2014

(65) Prior Publication Data
US 2014/0361430 A1 Dec. 11, 2014

(30) Foreign Application Priority Data
Jun. 7, 2013 (JP) .................... 2013-121005

(51) Int. Cl.
*H01L 23/498* (2006.01)
*H01L 23/00* (2006.01)

(52) U.S. Cl.
CPC .... *H01L 23/49811* (2013.01); *H01L 23/49827* (2013.01); *H01L 24/11* (2013.01); *H01L 24/13* (2013.01); *H01L 24/97* (2013.01); *H01L 2224/16145* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/83192* (2013.01); *H01L 2924/15311* (2013.01)

(58) Field of Classification Search
CPC .............. H01L 23/49811; H01L 23/49827
USPC ........................... 257/737, 776, 780
See application file for complete search history.

(56) References Cited

U.S. PATENT DOCUMENTS

| 7,728,442 B2 * | 6/2010 | Yoshioka et al. ............ 257/780 |
| 8,436,378 B2 | 5/2013 | Kojima et al. |
| 8,552,552 B2 * | 10/2013 | Suzuki .......................... 257/737 |
| 2008/0099894 A1 * | 5/2008 | Yoshioka et al. ............ 257/673 |
| 2011/0074042 A1 * | 3/2011 | Tsukuda ....................... 257/774 |

FOREIGN PATENT DOCUMENTS

| JP | 2004-349621 A | 12/2004 |
| JP | 2011-204840 A | 10/2011 |
| JP | 2012-079973 A | 4/2012 |

* cited by examiner

*Primary Examiner* — Christine Enad
(74) *Attorney, Agent, or Firm* — Miles & Stockbridge P.C.

(57) ABSTRACT

A semiconductor chip and a wiring board are coupled to each other through conductor posts. The centers of conductor posts situated above openings at the outermost periphery shift from the centers of the openings in a direction away from the center of the semiconductor chip. When a region where each of the conductor posts and an insulating layer are overlapped with each other is designated as an overlapped region, the width of the overlapped region more on the inner side than the opening is smaller than the width of the overlapped region more on the outer side than the opening. Thus, while stress applied to the conductor posts is relaxed, coupling reliability between the semiconductor chip and the wiring board is retained.

7 Claims, 23 Drawing Sheets

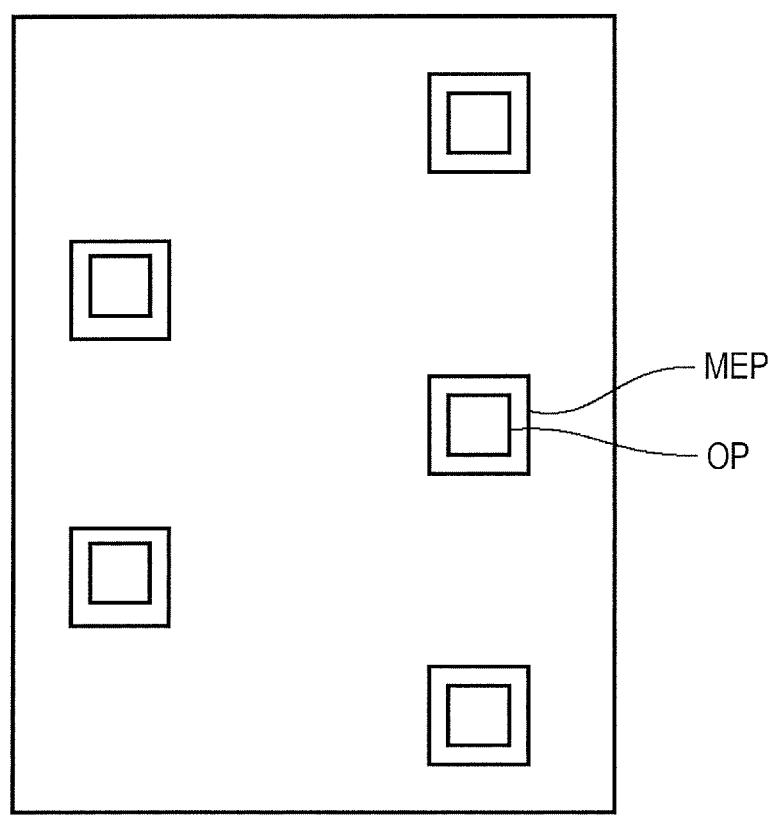

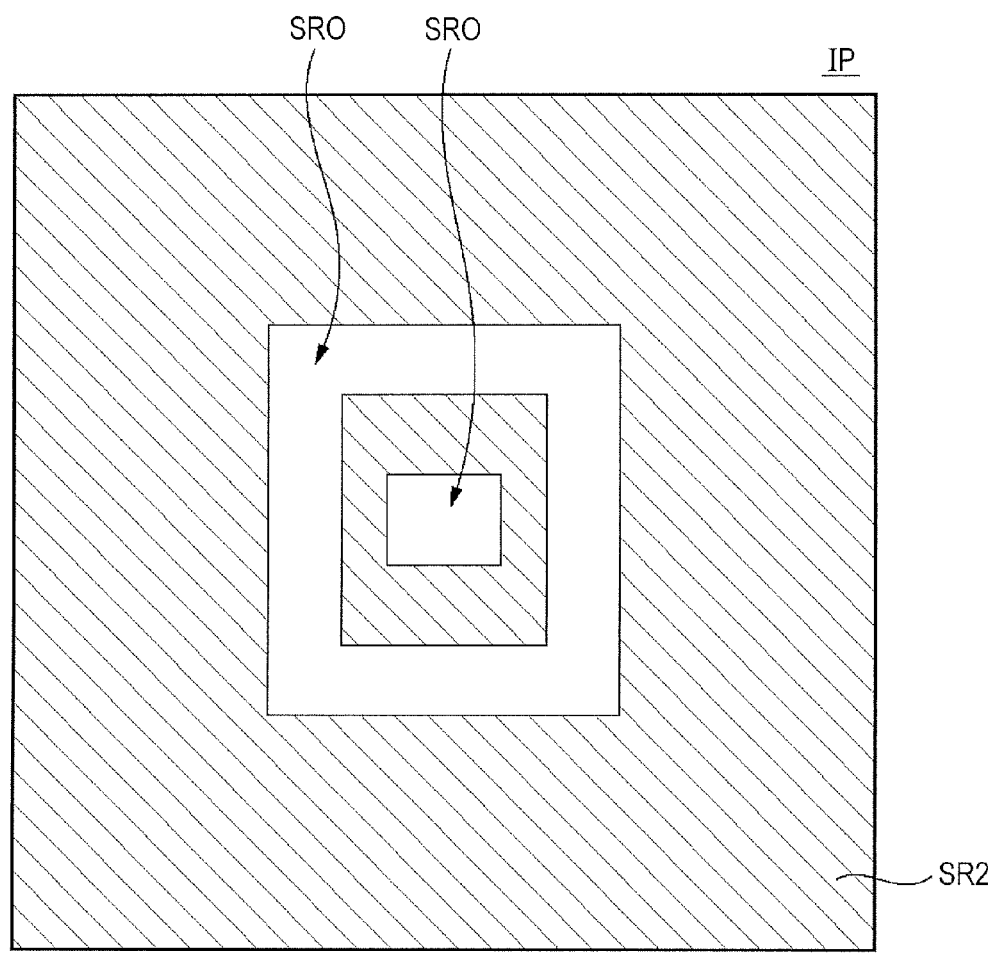

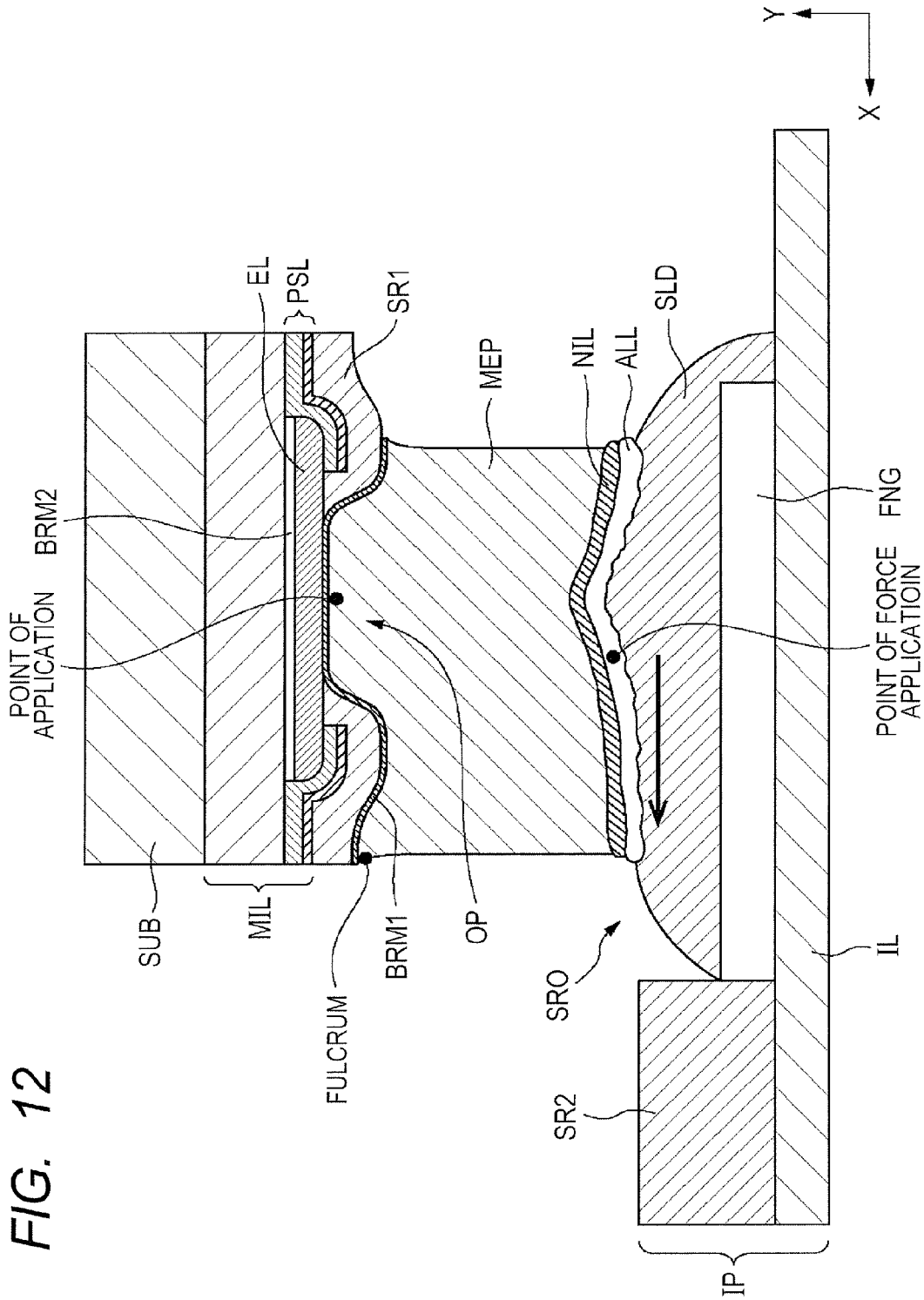

SEMICONDUCTOR DEVICE

CROSS-REFERENCE TO RELATED APPLICATIONS

The disclosure of Japanese Patent Application No. 2013-121005 filed on Jun. 7, 2013 including the specification, drawings and abstract is incorporated herein by reference in its entirety.

BACKGROUND

The present invention relates to a semiconductor device, for example, a technology which can be applied to a semiconductor device having conductor posts.

A semiconductor device is used while a semiconductor chip is mounted over a wiring board. Methods of mounting a semiconductor chip to a semiconductor device generally include one using wire bonding and flip chip mounting. In contrast to these, a method in which a semiconductor chip is face-down mounted over a wiring board by forming conductor posts over the electrodes of a semiconductor chip and forming a solder layer over the conductor posts is now under study. Technologies related to the conductor posts include one disclosed by Patent Document 1.

Patent Document 2 discloses that bumps are shifted from electrodes when the bumps are to be formed over the electrodes. Patent Document 3 teaches that the openings of a mask are shifted from electrodes when bumps are to be formed over the electrodes by using a printing technique. Stated more specifically, as for the electrodes positioned at the corners of a chip, Patent Document 3 teaches that the openings of the mask are shifted away from the center of a chip.

PRIOR ART DOCUMENTS

Patent Documents

[Patent Document 1]
Japanese Unexamined Patent Publication No. 2011-204840
[Patent Document 2]
Japanese Unexamined Patent Publication No. 2012-79973
[Patent Document 3]
Japanese Unexamined Patent Publication No. 2004-349621

SUMMARY

The linear thermal expansion coefficient of a semiconductor chip differs from the linear thermal expansion coefficient of a wiring board in a plane direction horizontal to the wiring board. Therefore, when a temperature change occurs in a semiconductor device, stress is produced in a shear direction at the interface between the semiconductor chip and the wiring board. When the semiconductor chip and the wiring board are coupled to each other by conductor posts, this stress is applied to the conductor posts. As the distance from the center of the semiconductor chip increases, stress applied to the conductor posts becomes larger. Therefore, peeling may occur at the interface between the electrode and the conductor post situated at the corner of the semiconductor chip. Especially when the temperature of an insulating layer SR1 becomes higher than its softening point, the insulating layer SR1 cannot absorb stress, whereby this probability becomes high.

In contrast to this, it is conceivable that an insulating film is caused to run over the periphery of the electrode and further the periphery of the conductor post is caused to run over this insulating film. According to this structure, stress applied to the conductor post is relaxed by the insulating film. However, to increase the run-over amount of the periphery of the conductor post, the diameter of the conductor post must be made large, or the opening for exposing the electrode formed in the insulating film must be made small. However, when the diameter of the conductor post is made large, the pitch of the conductor posts becomes small, whereby adjacent conductor posts may be short-circuited via solder. When the opening is made small, coupling resistance between the conductor post and the electrode becomes large. Thus, it has been difficult to retain coupling reliability between the semiconductor chip and the wiring board while stress applied to the conductor posts is relaxed. Other objects and novel features will become apparent from the description of the specification and the accompanying drawings.

Means for Solving the Problems

A portion where the conductor post and the insulating film are overlapped with each other is designated as an overlapped region. A first straight line extends from the center of a first conductor post which is closest to one end of the first side of the semiconductor chip as a starting point to the center of the substrate of the semiconductor chip as an end point. According to an embodiment of the present invention, a first width which is the width of the overlapped region situated on the first straight line is smaller than a second width which is the width of the overlapped region on an extension line which extends in a direction where the first straight line passes through the center of the first conductor post. A second straight line which is a straight line passing through the center of the first conductor post and the center of a first opening overlapped with the first, conductor post out of openings formed in the insulating film and the first side intersect each other at an angle other than 90°.

According to the above embodiment of the present invention, coupling reliability between the semiconductor chip and the wiring board can be retained while stress applied to the conductor posts is relaxed.

BRIEF DESCRIPTION OF THE DRAWINGS

FIG. 7 is a diagram for explaining the relative positions of an opening and a conductor post above it in a third region;

FIG. 8 is a diagram for explaining the shape of an opening in the wiring board;

FIG. 12 is a sectional view for explaining a coupling structure between the conductor post of the semiconductor chip and the first terminal of the wiring board;

DETAILED DESCRIPTION

A preferred embodiment of the present invention will be described hereinbelow with reference to the accompanying drawings. In all the drawings, similar constituent elements are given like reference symbols and their descriptions are omitted.

Embodiment

Figure 1A:
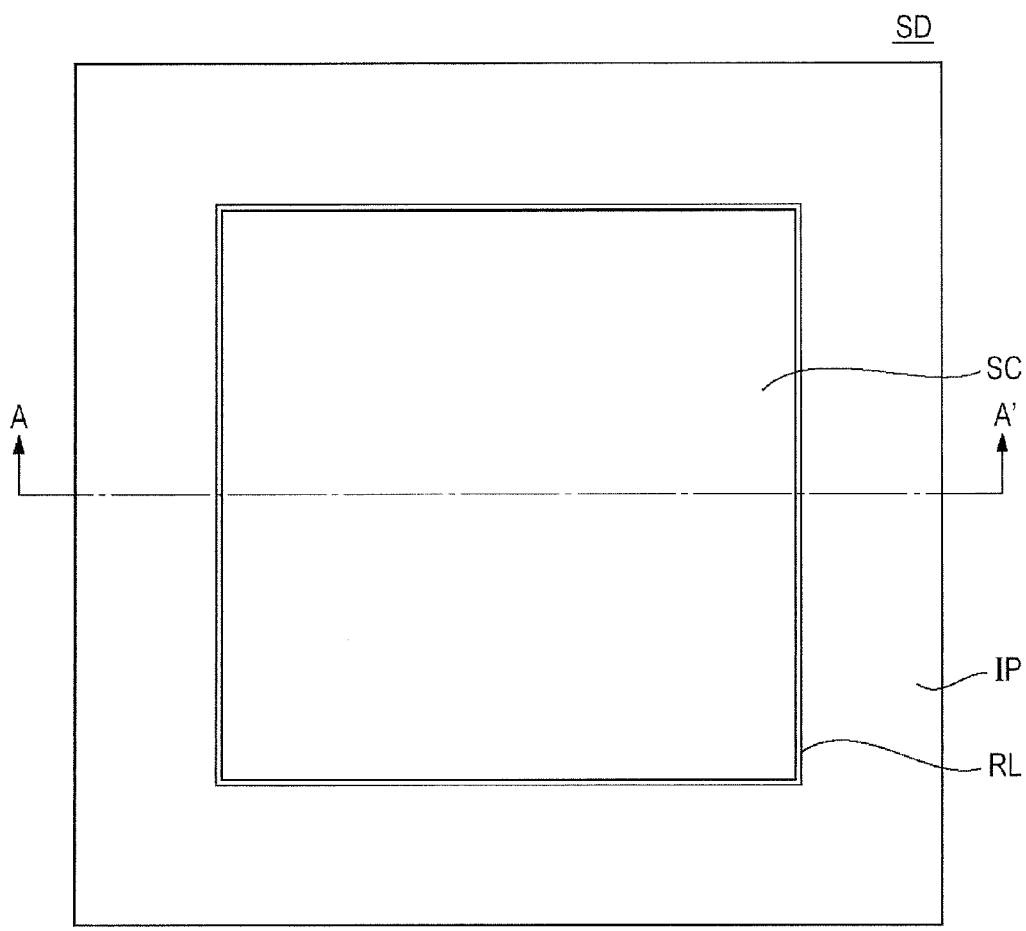
FIG. 1A is a plan view of a semiconductor device according to an embodiment of the present invention and FIG. 1B is a A-A' sectional view of FIG. 1A.
Figure 1B:
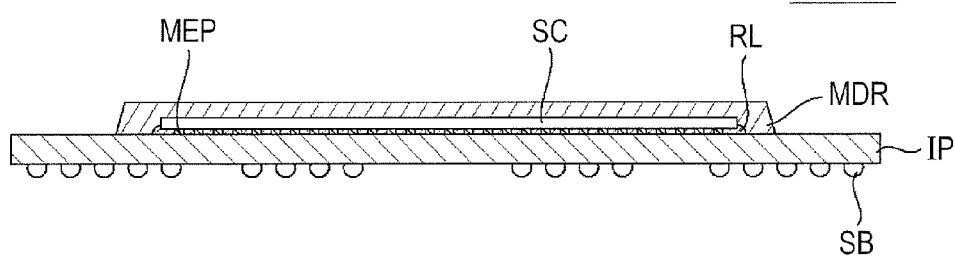

FIG. 1A is a plan view of a semiconductor device SD according to this embodiment. FIG. 1B is an A-A' sectional view of FIG. 1A. In FIG. 1A, a sealing resin MDR is omitted for the purpose of illustration.

The semiconductor device SD comprises a wiring board IP and a semiconductor chip SC. The semiconductor chip SC has a plurality of electrodes which are mounted over the first surface of the wiring board IP in such a manner that they face the first surface of the wiring board IP. The electrodes EL (which will be described hereinafter) of the semiconductor chip SC and the terminals of the wiring board IP are coupled to each other by using conductor posts MEP. The space between the semiconductor chip SC and the wiring board IP is sealed with a sealing material RL. The sealing material RL is, for example, NCF (Non Conductive Film) and may be NCP (Non Conductive Paste) or underfill resin as will be described hereinafter.

The first surface of the wiring board IP and the semiconductor chip SC are sealed with a sealing resin MDR. In the example shown in FIG. 1B, the periphery of the sealing resin MDR is located on the inner side of the wiring board IP in the plan view. The periphery of the sealing resin MDR and the periphery of the wiring board may form the same plane.

A plurality of external terminals SB, for example, solder balls are formed over the second surface which is opposite to the first surface of the wiring board IP. The external terminals SB are used to mount the semiconductor device SD to a circuit board (for example, a mother board).

Both of the wiring board IP and the semiconductor chip SC are rectangular or square. The semiconductor chip SC is smaller than the wiring board IP. The length of one side of the wiring board IP is, for example, 8 mm or more and 15 mm or less. The length of one side of the semiconductor chip SC is, for example, 3 mm or more and 10 mm or less. The thickness of the wiring board IP is, for example, 0.2 mm or more and 0.6 mm or less. The thickness of the semiconductor chip SC is, for example, 0.05 in or more and 0.4 mm or less.

Figure 2:
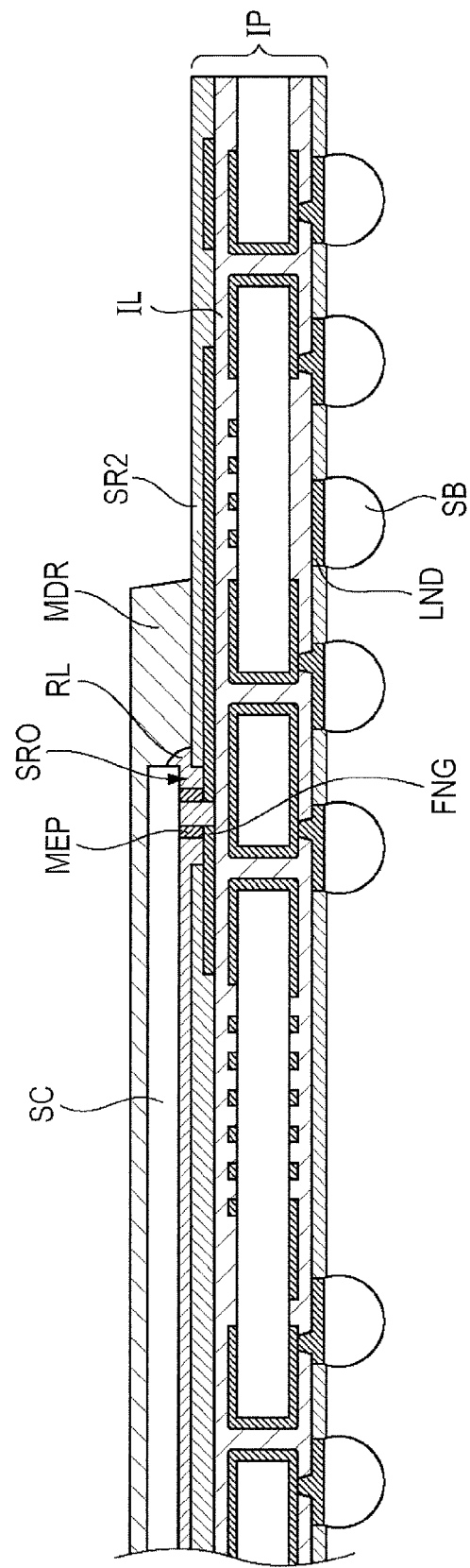
FIG. 2 is an enlarged view of part of the structure shown in FIG. 1B.

FIG. 2 is an enlarged view of part of the structure shown in FIG. 1B. In the example shown in this figure, the wiring board IP is a built-up substrate and has four wiring layers. A wiring layer which is located closest to the second surface (lower side in the figure) has a plurality of second terminals LND (for example, lands). The external terminals SB are attached to the respective second terminals LND.

A wiring layer located closest to the first surface (upper side in the figure) of the wiring board IP is situated over an insulating layer IL and has a plurality of first terminals FNG. The first terminals FNG are coupled to the respective conductor posts MEP. An insulating layer SR2, for example, a solder resist layer is formed over the first surface of the wiring board IP. Openings SRO are formed in the insulating layer SR2. The first terminals FNG are located in the respective openings SRO.

Figure 3:
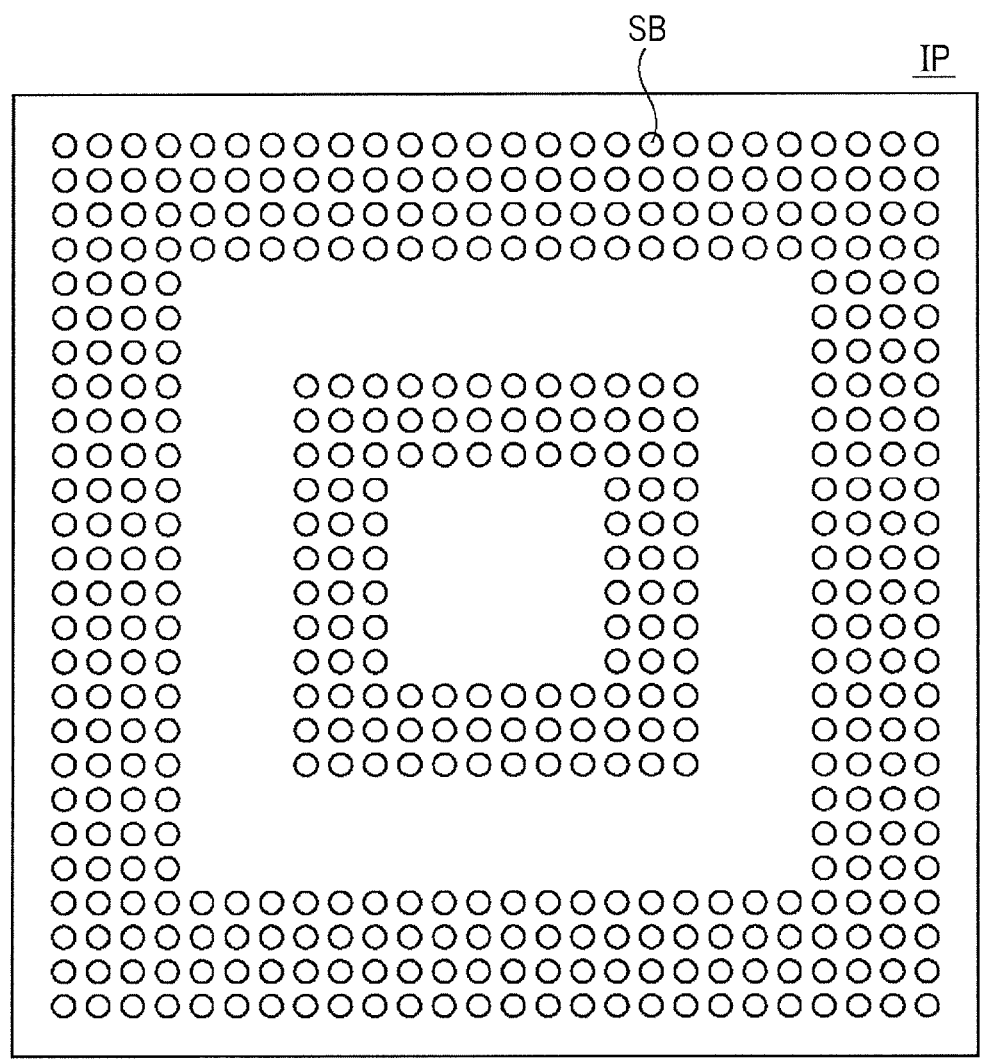
FIG. 3 is a diagram showing the layout of external terminals formed over the second surface of a wiring board.

FIG. 3 is a diagram showing the layout of the external terminals SB over the second surface of the wiring board IP. In the plan view, the external terminals SB are provided in a region on the central side of the wiring board IP and a region on the peripheral side of the wiring board IP. The distance between external terminals SB at the outermost positions of the region on the central side and external terminals SB at the innermost positions of the region on the peripheral side is larger than the total distance of the external terminals SB in the region on the central side and the total distance of the external terminals SB in the region on the peripheral side. The layout of the external terminals SB is not limited to the layout shown in this figure. For example, the external terminals SB may be provided only in the region on the peripheral side of the wiring board IP or over the entire surface of the wiring board IP.

Figure 4:
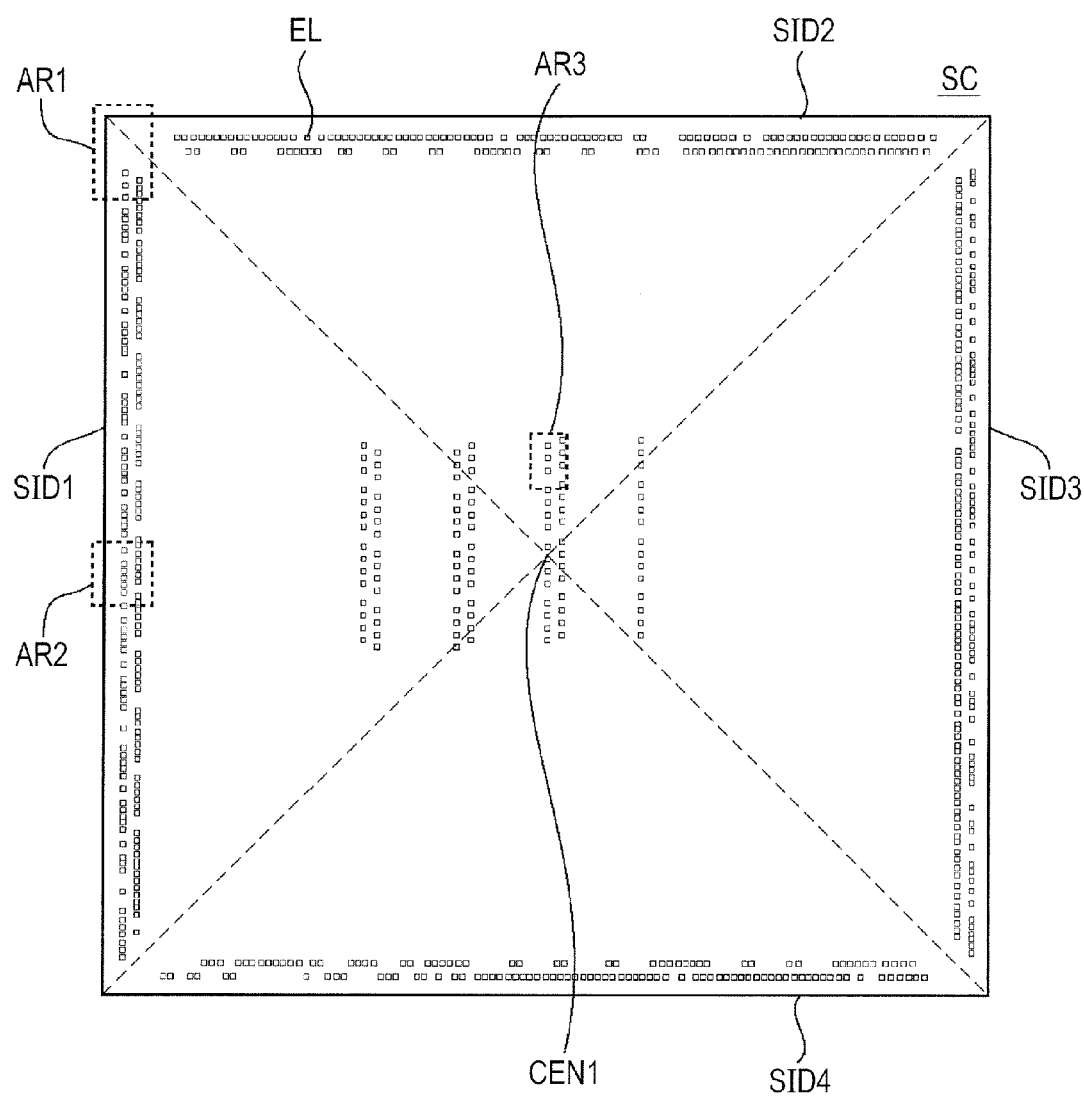
FIG. 4 is a diagram for explaining the arrangement of electrodes in a semiconductor chip.

FIG. 4 is a diagram for explaining the arrangement of the electrodes EL in the semiconductor chip SC. The electrodes EL are arranged in a plurality of rows (two rows in this figure) along the four sides (first side SID1, second side SID2, third side SID3 and fourth side SID4) of the semiconductor chip SC. An insulating layer SR1 (which will be described hereinafter) is formed over the surface having the electrodes EL of the semiconductor chip SC. Openings OP are formed in the insulating layer SR1. The openings OP are formed above the respective electrodes EL. The conductor posts MEP are formed above the respective openings OP. The openings OP may not be arranged at equal intervals. For example, most of the openings OP are arranged at equal intervals but the intervals of some openings OP may be wider than the other intervals. The rows of the openings OP may form a square grid or zigzag.

In the example shown in this figure, a plurality of electrodes EL and a plurality of openings OP are formed in the central part of the semiconductor chip SC. Conductor posts MEP are also formed above the openings OP. The layout density of the conductor posts MEP in the central part of the semiconductor chip SC is lower than the layout density of the conductor posts MEP in the peripheral part of the semiconductor chip SC.

In the plan view, each of the conductor posts MEP is larger in size than each of the openings OP. Therefore, the periphery of the conductor post MEP runs over the insulating layer SR1. In the example shown in this figure, all the periphery of the conductor post MEP runs over the insulating layer SR1.

In the plan view, the relative positions of the center of the conductor post MEP and the center of the opening OP differ according to the position of the opening OP in the semiconductor chip SC. For example, as for the opening OP and the conductor post MEP located at the outermost periphery, the center of the conductor post MEP shifts from the center of the opening OP overlapped with the conductor post MEP in a direction toward the external side of the semiconductor chip SC. The shifting direction can be considered as radial, for example, when the center CEN1 of the semiconductor chip SC is a basis.

Explanation will be made hereinbelow, taking a first region AR1, a second region AR2 and a third region AR3 for examples. The first region AR1 contains openings OP (first openings OP1) closest to one end of the first side SID1 of the semiconductor chip SC. The second region AR2 contains openings OP closest to the center of the first side SID1. The third region AR3 contains openings OP in the central part of the semiconductor chip SC.

In the following description, the center CEN1 of the semiconductor chip SC is defined, for example, as the point of intersection between the diagonal lines of the semiconductor chip SC. The content described with reference to FIGS. 5, 6 and 7 can be also applied to the three sides (second side SID2, third side SID3 and fourth side SID4) other than the first side SID1.

Figure 5A:
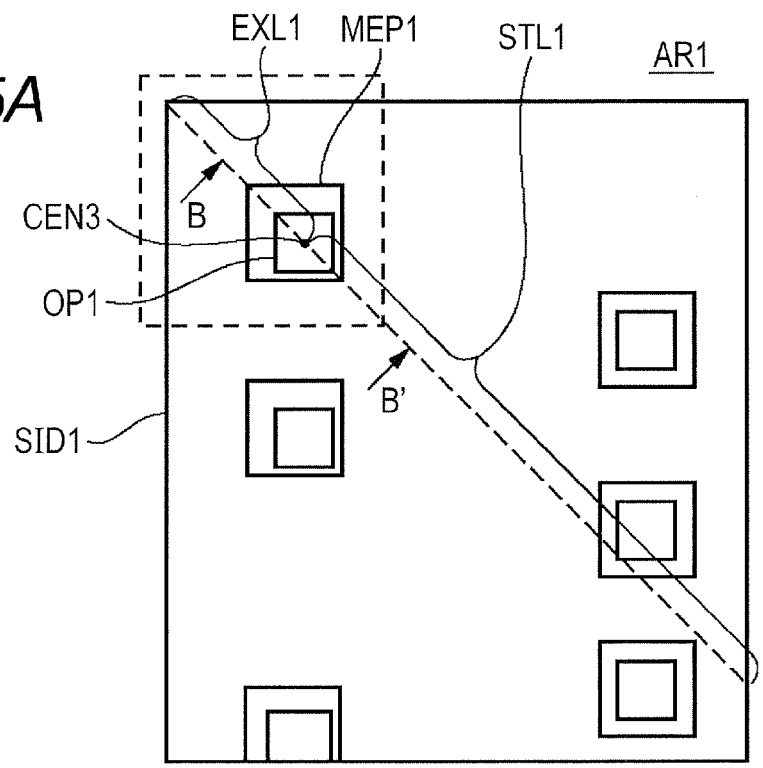
FIG. 5A is a diagram for explaining the relative positions of a first opening and a conductor post above it in a first region and FIG. 5B is an enlarged view of the region surrounded by a dotted line in FIG. 5A.
Figure 5B:
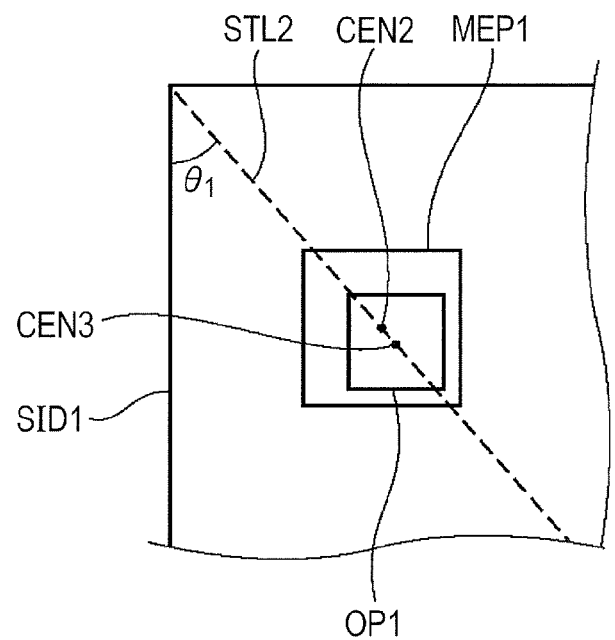

FIG. 5A is a diagram for explaining the relative positions of the first opening OP1 and the conductor post EMP (first conductor post MEP1) located above the opening OP1 in the first region AR1. FIG. 5B is an enlarged view of the region surrounded by a dotted line in FIG. 5A.

As described with reference to FIG. 4, the openings OP and the conductor posts MEP are arranged in a plurality of rows along the first side SID1. The centers of the openings OP except for the openings at the outermost periphery almost align with the centers of the conductor posts MEP located above the openings OP. In contrast to this, the centers of the openings OP located at the outermost periphery shift from the centers of the conductor posts MEP located above the openings OP.

Stated more specifically, as shown in FIG. 5A, the centers of the conductor posts MEP located above the openings OP at the outermost periphery shift from the centers of the openings OP in a direction away from the center CEN1 Of the semiconductor chip SC. Particularly, the position of the first opening OP1 and the position of the first conductor post MEP1 are to be compared with each other. A straight line extending from the center CEN3 of the first opening OP1 as a starting point to the center CEN1 of the semiconductor chip SC (center of the substrate of the semiconductor chip SC) as an end point is designed as a first straight line STL1. A region where the conductor post MEP and the insulating layer SR1 are overlapped with each other is designated as an overlapped region. The width (first width) of the overlapped region situated on the first straight line STL1 is smaller than the width (second width) of the overlapped region on an extension line EXL extending toward the external side of the semiconductor chip SC of the first straight line STL1 (that is, an extension line of the first straight line STL1 in a direction passing through the center of the first conductor post MEP1). In other words, the width of the overlapped region closer to the central side of the semiconductor chip SC than the first opening OP1 is smaller than the width of the overlapped region closer to the first side SID1 than the first opening OP1.

As shown in FIG. 5B, the center CEN2 of the first conductor post MEP1 is farther away from the center CEN1 of the semiconductor chip SC than the center CEN3 of the first opening OP1. Further, the angle $\theta_1$ formed by a straight line passing through the center CEN2 and the center CEN3 (second straight line STL2) and the first side SID1 is not 90° (less than 90° according to the definition of the figure).

Figure 6A:
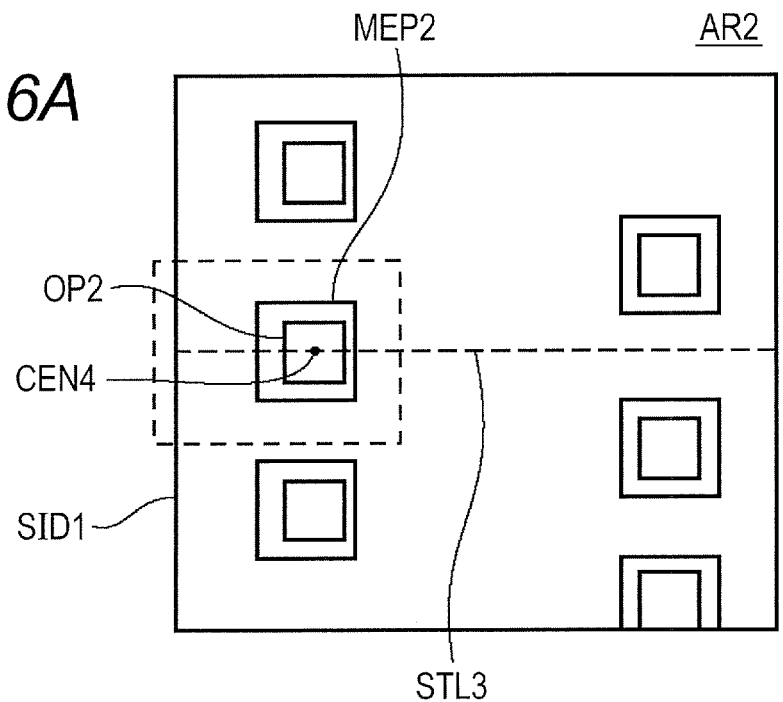
FIG. 6A is a diagram for explaining the relative positions of an opening and a conductor post above it in a second region and FIG. 6B is an enlarged view of the region surrounded by a dotted line in FIG. 6A.

FIG. 6A is a diagram for explaining the relative positions of the openings OP and the conductor posts MEP above the openings in the second region AR2. FIG. 5B is an enlarged view of the region surrounded by a dotted line in FIG. 5A. Also in the second region AR2, the centers of the openings OP other than the openings at the outermost periphery almost align with the centers of the conductor posts MEP situated above them. In contrast to this, the centers of the openings OP situated at the outermost periphery shift from the centers of the conductor posts MEP situated above them in a direction toward the first side SID1. Therefore, in the second region AR2, the width of the overlapped region closer to the central side of the semiconductor chip SC than the opening OP is smaller than the width of the overlapped region closer to the first side SID1 than the opening OP.

Figure 6B:
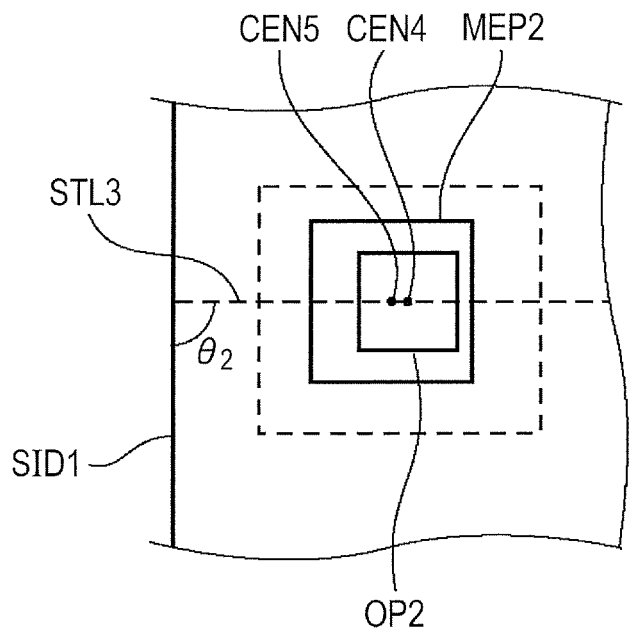

As shown in FIG. 6B, the center CEN5 of the conductor post MEP (second conductor post MEP2) closest to the center of the first side SID1 is farther away from the center CEN1 of the semiconductor chip SC than the center CEN4 of the opening OP (second opening OP2) overlapped with the second conductor post MEP2. The angle $\theta_2$ formed by a straight line (third straight line STL3) passing through the center CEN5 of the second conductor post MEP2 and the center CEN4 of the second opening OP2 and the first side SID1 is 90° or closer to 90° than $\theta_1$.

It is understood from FIG. 5 and FIG. 6 that the average value of the arrangement pitch of the conductor posts MEP in ⅓ of one end side of the first side SID1 (for example, the arrangement pitch of the conductor posts MEP in an area including the first region AR1) is larger than the average value of the arrangement pitch of the conductor posts MEP in the next ⅓ of the first side SID1 (for example, the arrangement pitch of the conductor posts MEP in an area including the second region AR2). In other words, as the distance from the center CEN1 of the semiconductor chip SC becomes larger, the center of the conductor post MEP with respect to the opening shifts more toward the external side of the semiconductor chip SC. In this case, a stress relaxation effect which will be described hereinafter becomes large.

It is also understood that the average value of the arrangement pitch of the conductor posts MEP is larger than the average value of the arrangement pitch of the openings OP. Therefore, as will be described hereinafter, the arrangepitch of the first terminals FNG of the wiring board IP can be made larger than the arrangement pitch of the openings OP.

As shown in FIG. 5 and FIG. 6, the centers of the conductor posts MEP in the second row from the external side almost align with the centers of the openings OP which overlap with the conductor posts MEP.

FIG. 7 is a diagram for explaining the relative positions of the openings OP and the conductor posts MEP above the openings OP in the third region AR3. As shown in this figure, in the third region AR3, the centers of the conductor posts MEP almost align with the centers of the openings OP. Even in the third region AR3, the centers of the conductor posts MEP may shift from the centers of the openings OP in a direction away from the center of the semiconductor chip SC, for example, a radial direction.

FIG. 8 is a diagram for explaining the shape of the opening SRO of the wiring board IP. This shows the surface over which the semiconductor chip SC is to be mounted of the wiring board IP. The opening SRO is formed in a region opposed to the conductor posts MEP of the semiconductor chip SC.

Stated more specifically, the conductor posts MEP are first arranged along the periphery of the semiconductor chip SC. Therefore, the opening SRO has a shape along the periphery of the semiconductor chip SC. The conductor posts MEP are also arranged in the central part of the semiconductor chip SC. Therefore, an opening SRO is also formed in the central part of the semiconductor chip SC. A plurality of first terminals FNG (not shown in this figure) are formed in the opening SRO. The first terminals FNG are situated at positions corresponding to the respective conductor posts MEP.

As described above, the centers of the conductor posts MEP situated at the periphery of the semiconductor chip SC shift from the centers of the openings OP corresponding to the conductor posts MEP. Therefore, the arrangement pitch of the first terminals FNG is larger than the arrangement pitch of the openings OP.

Figure 9:
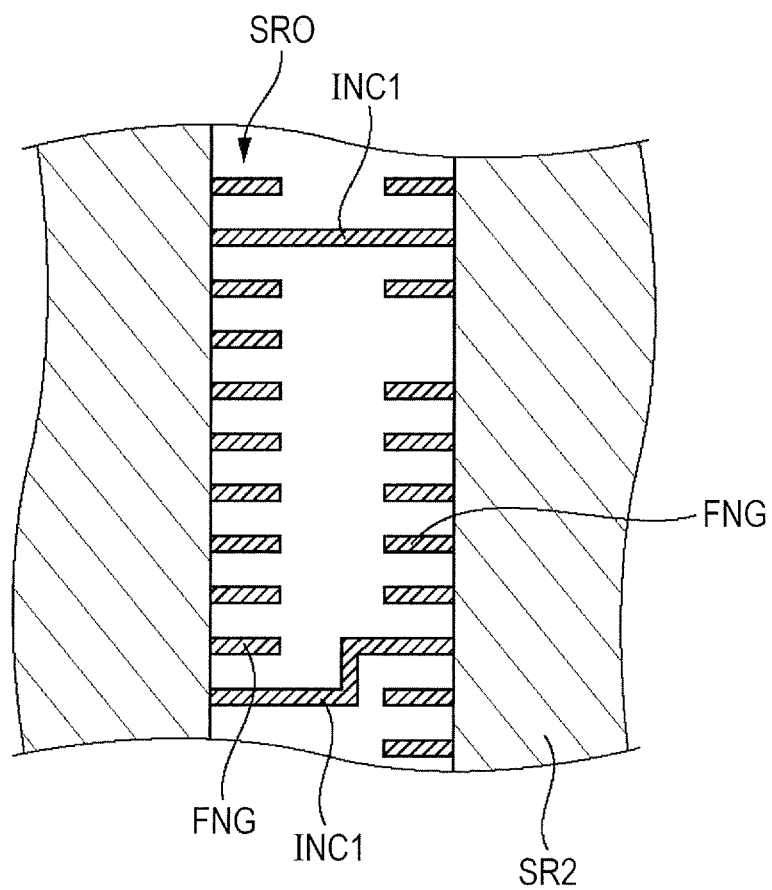
FIG. 9 is a diagram showing an example of the arrangement of first terminals in the opening.

FIG. 9 is a diagram showing an example of the arrangement of the first terminals FNG in the opening SRO. As described above, the arrangement pitch of the first terminals FNG is larger than the arrangement pitch of the openings OP of the semiconductor chip SC. Therefore, wirings INC1 can be arranged such that they pass between some of the first terminals FNG. The wirings INC1 are formed in the same layer as the first terminals FNG. A portion existent in the opening SRO of each of the wirings INC1 may be linear or partially bent.

Figure 10:
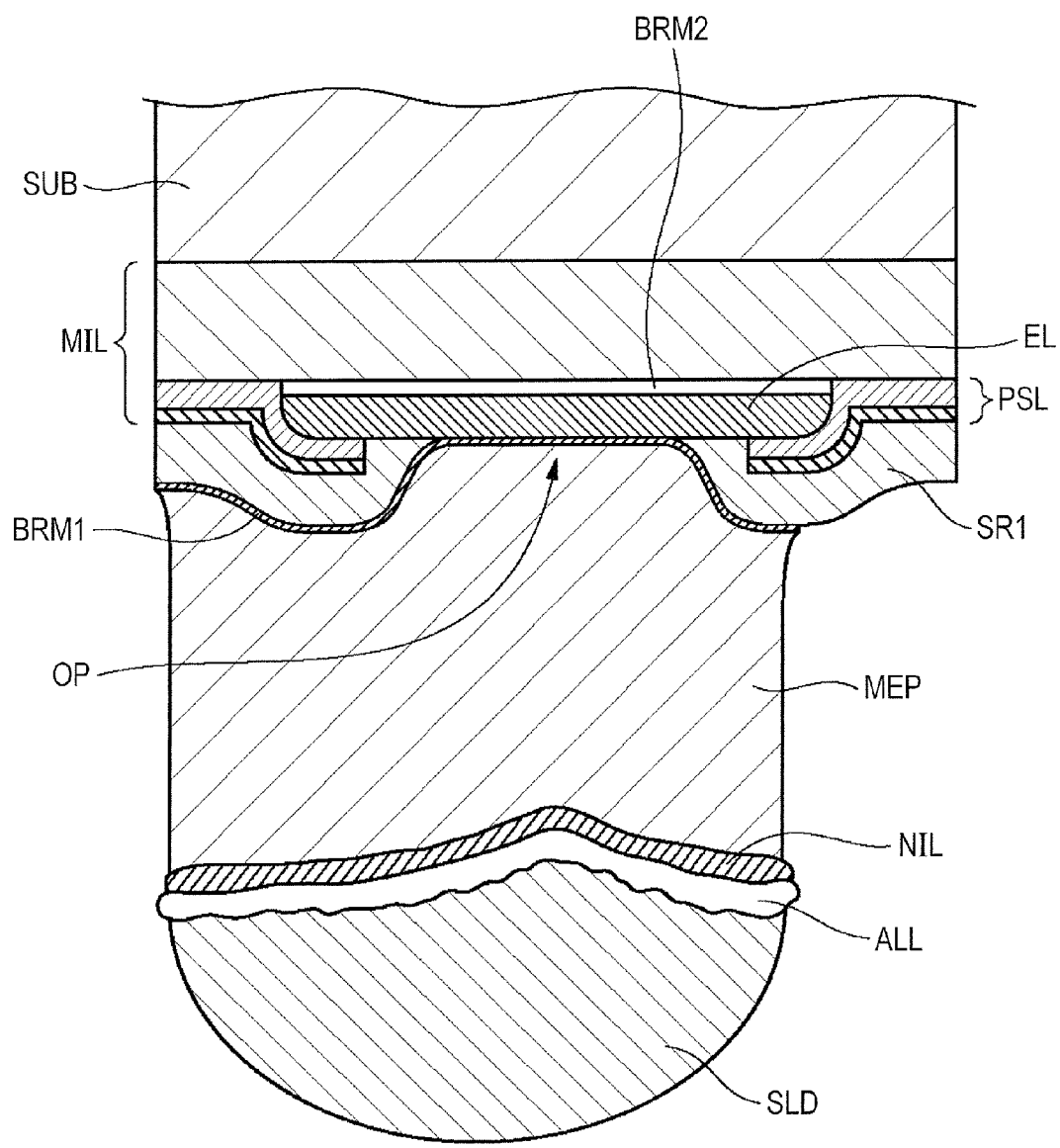
FIG. 10 is a sectional view showing the constitution of the conductor post.

FIG. 10 is a sectional view showing the constitution of the conductor post MEP. In the example shown in this figure, the semiconductor chip SC has multiple wiring layers MIL over the substrate SUB. The topmost wiring layer has electrodes EL. The topmost layer out of the multiple wiring layers MIL is a protective insulating film PSL, for example, a laminated film including a silicon oxide layer and a silicon nitride layer. Since part of each of the electrodes EL is situated in an opening formed in the protective insulating film PSL, it is exposed from the protective insulating film PSL. A barrier metal layer BRM2 is formed below the electrode EL.

An insulating layer SR1 is formed over the protective insulating film PSL. The insulating layer SR1 is, for example, a solder resist layer. An opening OP situated above the electrode EL is formed in the insulating layer SR1. A barrier metal layer BRM1 is formed over the electrode EL situated in the opening OP and the insulating layer SR1 situated around the electrode EL. The barrier metal layer BRM1 comprises at least one of a TiN layer, a Ti layer and a TiW layer.

A conductor post MEP is formed over the barrier metal layer BRM1. The conductor post MEP is made of, for example, columnar Cu. The height of the conductor post MEP is, for example, 15 µm or more and 50 µm or less. A Ni layer NIL, and a solder layer SLD are formed over the conductor post MEP in this order. The thickness of the Ni layer NIL is smaller than the height of the conductor post MEP. An alloy layer may be formed at at least one of the interface between the Ni layer NIL and the conductor post MEP and the interface between the Ni layer NIL and the solder layer SLD. In this figure, an alloy layer ALL is formed at the interface between the Ni layer NIL and the solder layer SLD.

The protective insulating film PSL (second insulating film) has a projection along the periphery of the electrode EL. Part (part on the left side in the figure) of the conductor post MEP is located on the outer side of the projection of the protective insulating film PSL. In the example shown in the figure, the other part (part on the right side in the figure) of the conductor post MEP is located on the inner side of the electrode EL. The part on the right side in the figure may also be located on the outer side of the electrode EL in the plan view.

Figure 11A:
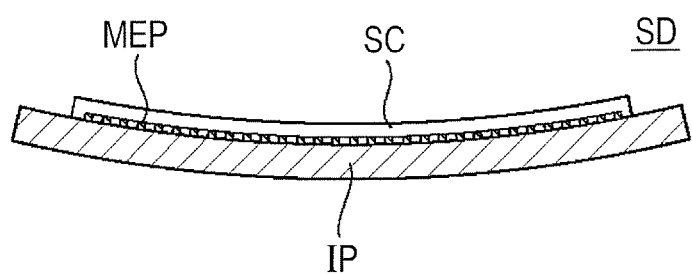
FIG. 11A and FIG. 11B are diagrams for explaining stress generated in the semiconductor device.
Figure 11B:
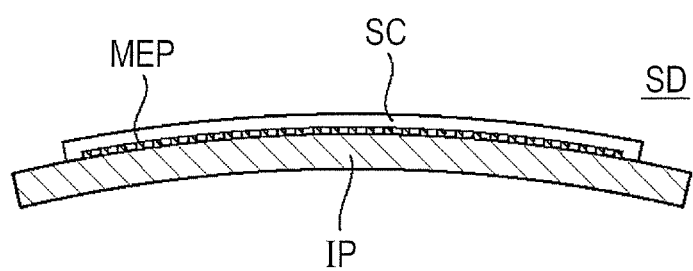

FIG. 11A and FIG. 11B are diagrams for explaining stress generated in the semiconductor device SD. The wiring board IP is formed by using a resin. Therefore, the linear expansion coefficient of the wiring board IP is larger than the linear expansion coefficient of the semiconductor chip SC. Consequently, when the temperature of the semiconductor device SD drops, as shown in FIG. 11A, compression stress is applied to the rear surface of the semiconductor chip SC. On the other hand, when the temperature of the semiconductor device SD rises, as shown in FIG. 11B tensile stress is applied to the rear surface of the semiconductor chip SC. Various measures to be taken when compression stress is applied to the rear surface of the semiconductor chip SC are now under study. To cope with this, the inventors of the present invention found that it is necessary to take a measure even when the temperature of the semiconductor device rises, that is, when tensile stress is applied to the rear surface of the semiconductor chip. SC. This will be explained with reference to FIG. 12.

FIG. 12 is a sectional view for explaining a coupling structure between the conductor post MEP of the semiconductor chip SC and the first terminal FNG of the wiring board IP. In this figure, the left side is the periphery of the semiconductor chip SC (for example, the first side SID1).

As shown in this figure, the conductor post MEP and the first terminal FNG are coupled to each other via the solder layer SLD. When the temperature of the semiconductor device SD is applied, force is applied to the coupling surface (top surface) with the solder layer SLD of the conductor post MEP in a direction for moving the conductor post MEP to the periphery of the semiconductor chip SC (from the right side to the left side in the figure). In this case, force is applied in a direction for stripping off the conductor post MEP from the electrode EL of the semiconductor chip SC with an end part close to the periphery of the semiconductor chip SC of the under surface of the conductor post MEP as a fulcrum.

To cope with this, in this embodiment, the center of the conductor post MEP is made closer to the periphery of the semiconductor chip SC than the center of the opening OP. Therefore, the distance from the fulcrum to the point of application can be made large for the distance from the point of force application to the fulcrum. Therefore, it is possible to prevent the conductor post MEP from separating from the semiconductor chip SC.

When at least one of the multiple wiring layers MIL is a low-permittivity film (for example, a porous film) having lower permittivity than that of a silicon oxide film, inconvenience such as exfoliation may occur in part located below the conductor post MEP of the low-permittivity film. In this embodiment, the occurrence of this inconvenience can be also suppressed.

A description is subsequently given of a method of producing the semiconductor chip SC with reference to FIGS. 13A to 13D. FIGS. 13A to 13D are sectional views showing the method of forming the conductor posts MEP of the semiconductor chip SC. In FIGS. 13A to 13D, for the sake of explanation, the center of the conductor post MEP is aligned with the center of the first opening OP1.

An element separation film is first formed over the substrate SUB (for example, a silicon wafer). Thereby, an element forming region is separated. The element separation film is formed by using, for example, the STI method, or may be formed by using the LOCOS method. Then, a gate insulating film and a gate electrode are formed over the substrate SUB located in the element forming region. The gate insulating film may be a silicon oxide film or a high-permittivity film having higher permittivity than that of the silicon oxide film (for example, a hafnium silicate film). When the gate insulating film is a silicon oxide film, the gate electrode is formed of a polysilicon film. When the gate insulating film is a high-permittivity film, the gate electrode is formed of a laminated film including a metal film (for example, TIN) and a polysilicon film. When the gate electrode is formed from polysilicon, a polysilicon resistor may be formed over the element separation film in the step of forming the gate electrode.

Then, a source and drain extension region is formed in the substrate SUB located in the element separation region. Thereafter, a side wall is formed over the side wall of the gate electrode. Impurity regions which will become a source and a drain are formed over the substrate SUB located in the element forming region. Thus, a MOS transistor is formed over the substrate SUB.

Then, the multiple wiring layers MIL are formed over the element separation film and the MOS transistor. The electrode EL is formed in the topmost wiring layer. At this point, the barrier metal layer BRM2 (not shown in FIG. 13) is formed below the electrode EL. Then, the protective insulating film PSL and the opening are formed over the multiple wiring layers MIL.

Figure 13A:
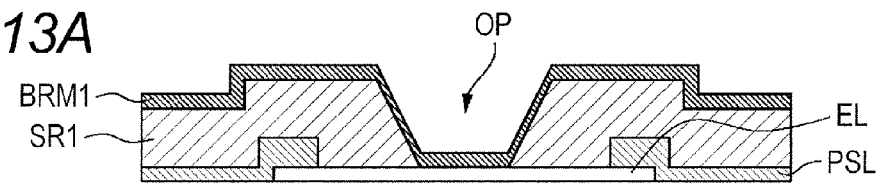
FIGS. 13A to 13D are sectional views showing a method of forming the conductor post in the semiconductor chip.

Then, as shown in FIG. 13A, an insulating layer SR1 and the opening OP of the insulating layer SR1 are formed above the protective insulating film PSL and the electrode EL. The insulating layer SR1 is formed, for example, by coating. When the insulating layer SR1 is a photosensitive film such as a solder-resist film, the opening OP of the insulating layer SR1 is formed by exposure and development. Then, the barrier metal layer BRM1 is formed over the insulating layer SR1 and the electrode EL.

Figure 13B:
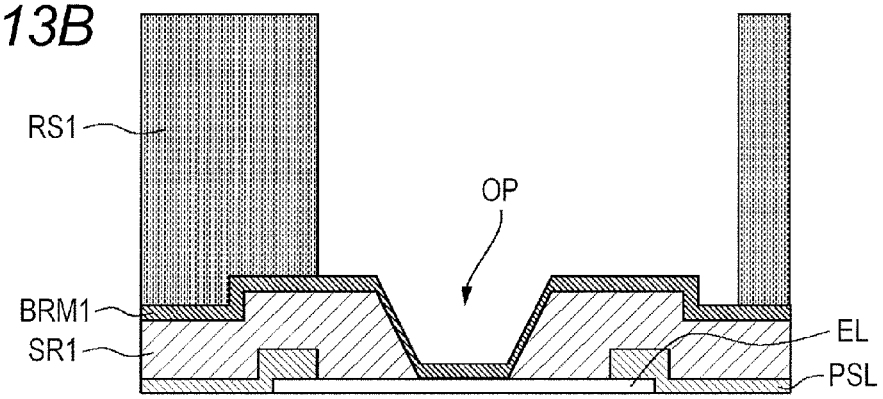

Then, as shown in FIG. 13B, a resist pattern RS1 is formed over the barrier metal layer BRM1. The resist pattern RS1 has an opening in a region in which the conductor post MEP is to be formed.

Figure 13C:
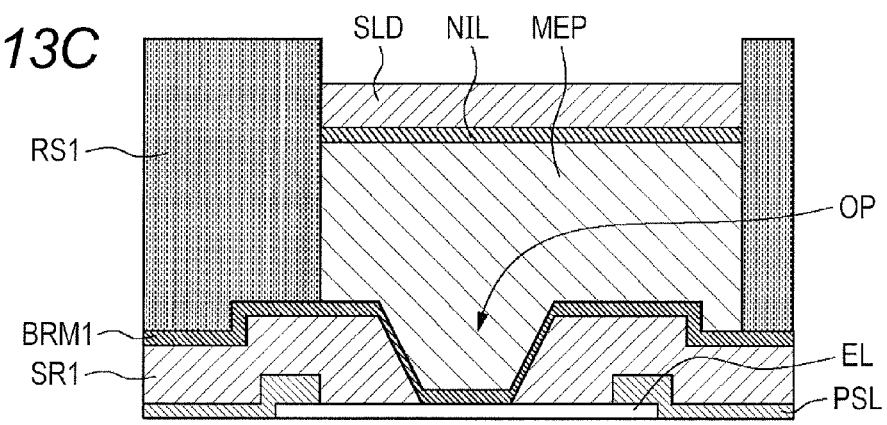

Then, as shown in FIG. 13C, plating is carried out by using the barrier metal layer BRM1 exposed from the resist pattern RS1 as a seed. Thereby, the conductor post MEP, the Ni layer NIL and the solder layer SLD are formed in this order.

Figure 13D:
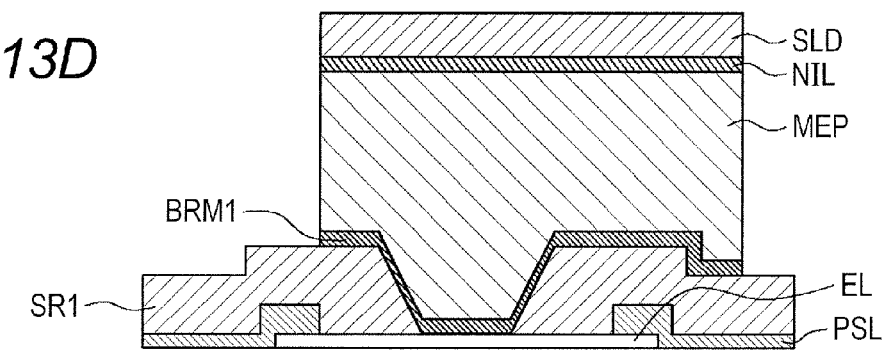

Thereafter, as shown in FIG. 13D, the resist pattern RS1 is removed. A portion not covered with the conductor post MEP of the barrier metal layer BRM1 is removed, for example, by wet etching.

Thereafter, the solder layer SLD is molten and then coagulated. The conductor post MEP is thus formed. After the conductor posts MEP are formed, the semiconductor chip SC is obtained as a separate piece by dicing.

FIGS. 14A to 14D are sectional views for explaining an example of a method of mounting the semiconductor chip SC to the wiring board IP. The method shown in these figures uses NCF as the sealing material' RL. The wiring board IP is first prepared. As shown in FIG. 15, a plurality of the wiring boards IP is coupled to one another.

An Ni layer and an Au layer are formed over the top surfaces, side surfaces and end surfaces of the first terminals FNG of the wiring board IP. A Pd layer may be formed between the Ni layer and the Au layer. A solder layer such as a Sn or SnAg layer may be formed over these surfaces, or these surfaces may be subjected to OSP processing (preflux processing).

Figure 14A:
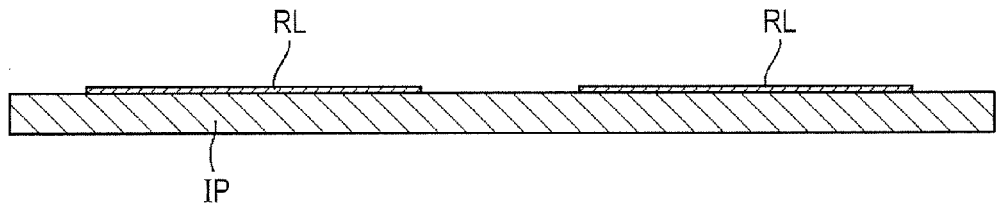
FIGS. 14A to 14D are sectional views for explaining an example of a method of mounting the semiconductor chips to the wiring board.
Figure 15:
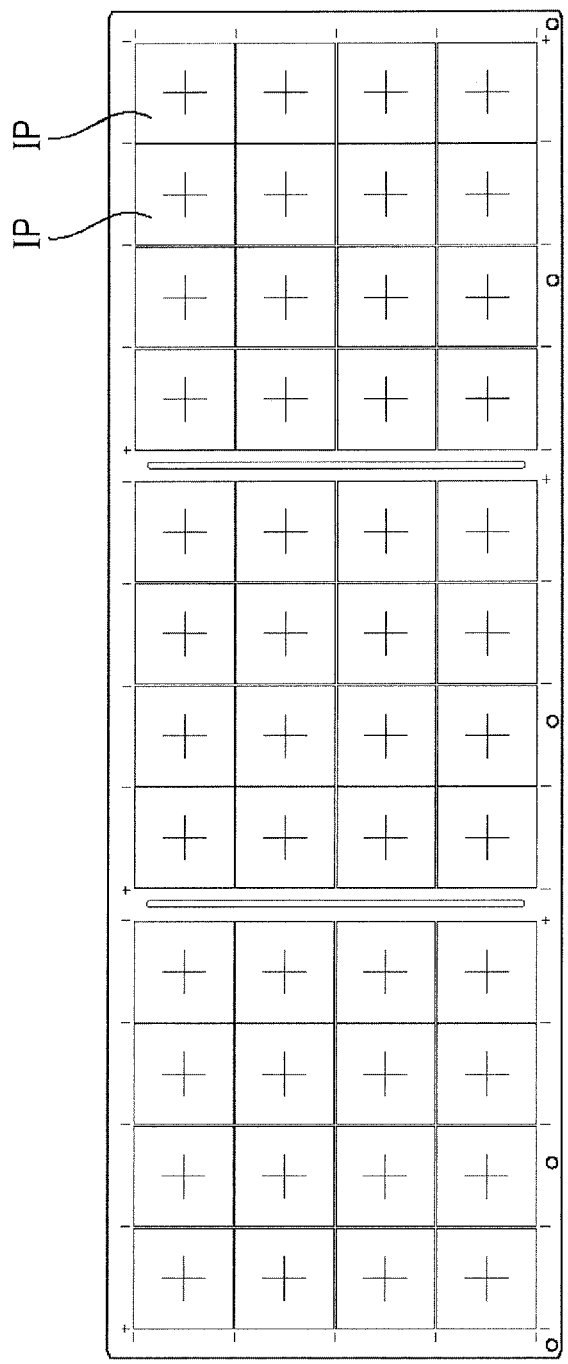
FIG. 15 is a plan view showing the constitution of the wiring boards.

Then, as shown in FIG. 14A, NCF as a sealing material RL is arranged over a plurality of wiring boards IP.

Figure 14B:
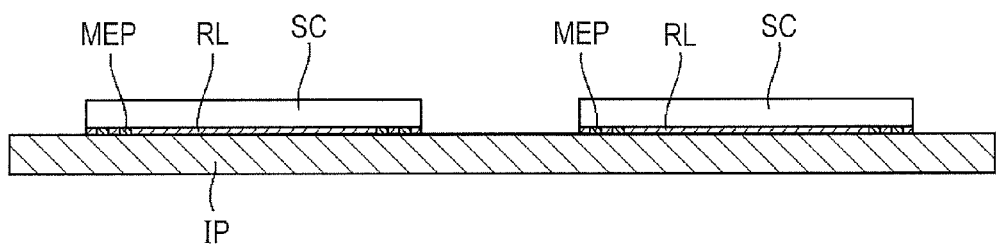

Then, as shown in FIG. 14B, the semiconductor chip SC is arranged over the sealing material RL in such a manner that the conductor posts MEP face the wiring board IP. Thereafter, the semiconductor chip SC is pressed into the sealing material RL. Thereby, the first terminals FNG (not shown in the figure) of the wiring board IP and the solder layer SLD (not shown in the figure) over the conductor posts MEP of the semiconductor chip SC are brought into contact with each other. In this state, the semiconductor chip SC and the wiring board IP are heated and then cooled. Thereby, the solder layer SLD is bonded to the first terminals FNG.

Figure 14C:
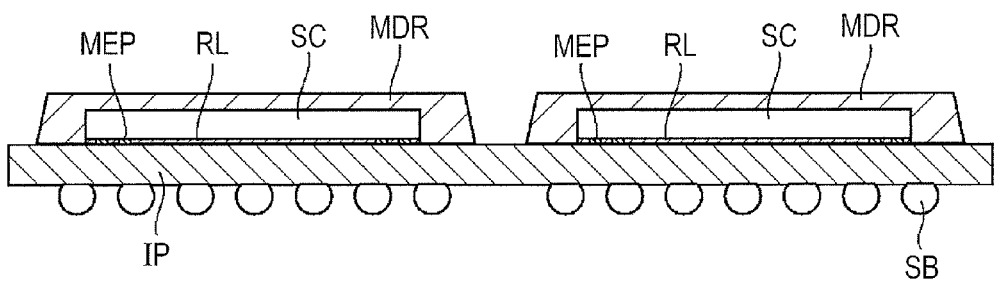

Then, as shown in FIG. 14C, the plurality of wiring boards IP and the plurality of semiconductor chips SC are sealed independently with the sealing material MDR. The external terminals SB are attached to the second surfaces of the wiring boards IP.

Figure 14D:
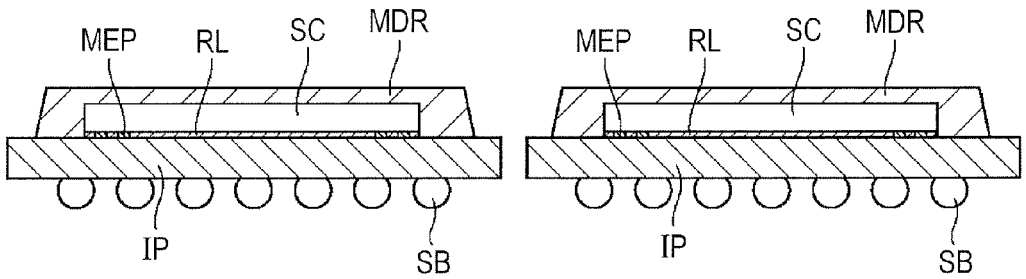

Then, as shown in FIG. 14D, the wiring boards IP are diced to obtain individual semiconductor devices SD.

In the step shown in FIG. 14A, NCP (Non Conductive Paste) may be coated on the wiring board in place of NCF, or an underfill resin may be impregnated between the semiconductor chip SC and the wiring board IP by making use of a capillary phenomenon after the semiconductor chip SC is mounted to the wiring board IP. NCF may be affixed to the semiconductor chip SC and not to the wiring board IP.

According to this embodiment, when a region where the conductor post MEP and the insulating layer SR1 are overlapped with each other is designated as an overlapped region, the width of the overlapped region closer to the central side of the semiconductor chip SC than the first opening OP1 is smaller than the width of the overlapped region closer to the first side SID1 than the first opening OP1. Therefore, when the temperature of the semiconductor device SD rises, it is possible to prevent the conductor post MEP from separating from the semiconductor chip SC.

(Modification 1)

Figure 16:
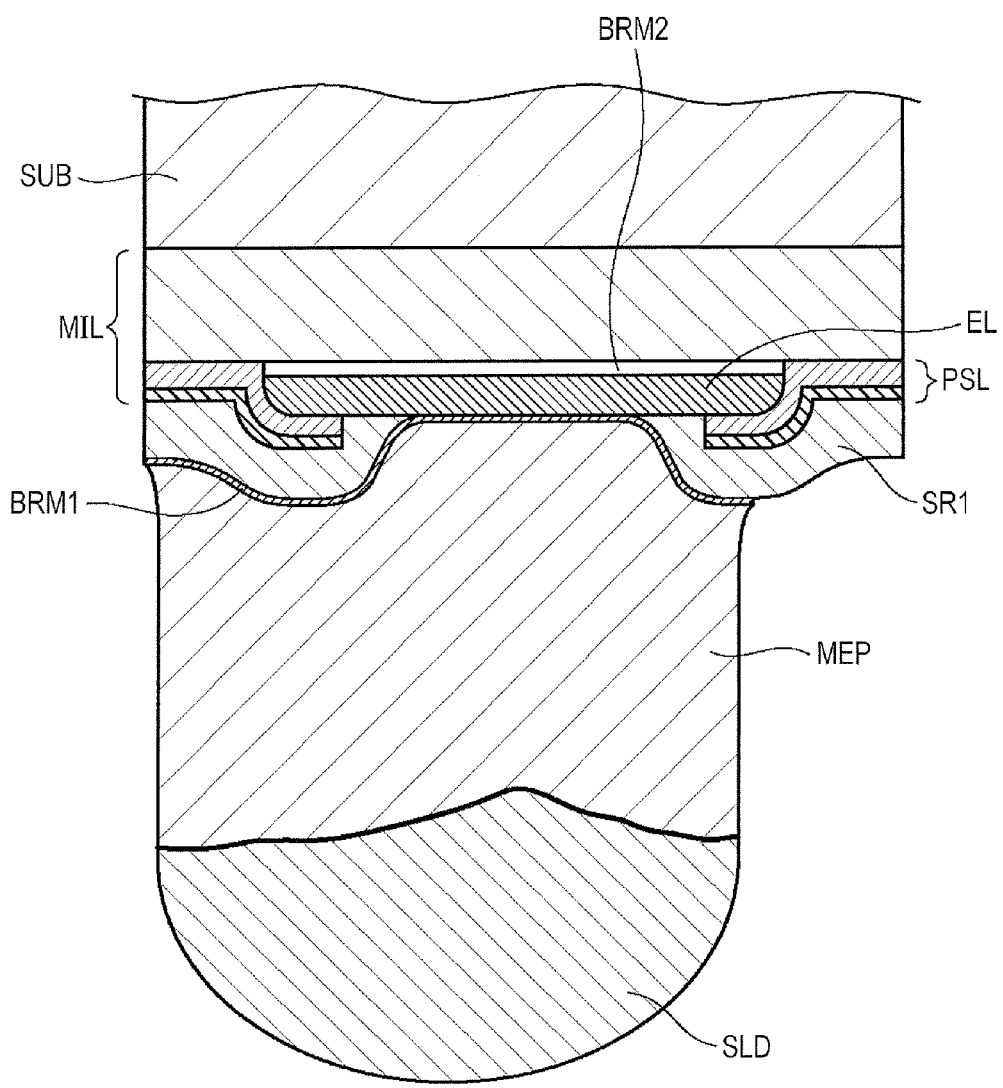
FIG. 16 is a sectional view showing the constitution of the semiconductor chip of a semiconductor device according to modification 1.

FIG. 16 is a sectional view showing the constitution of the semiconductor chip SC of a semiconductor device SD according to modification 1. The semiconductor chip SC shown in this figure has the same constitution as that of the semiconductor chip SC according to the above embodiment except that it does not have the Ni layer NIL and the alloy layer ALL between the conductor post MEP and the solder layer SLD.

The same effect as that of the semiconductor device SD according to the above embodiment can be obtained by this modification as well.

(Modification 2)

Figure 17:
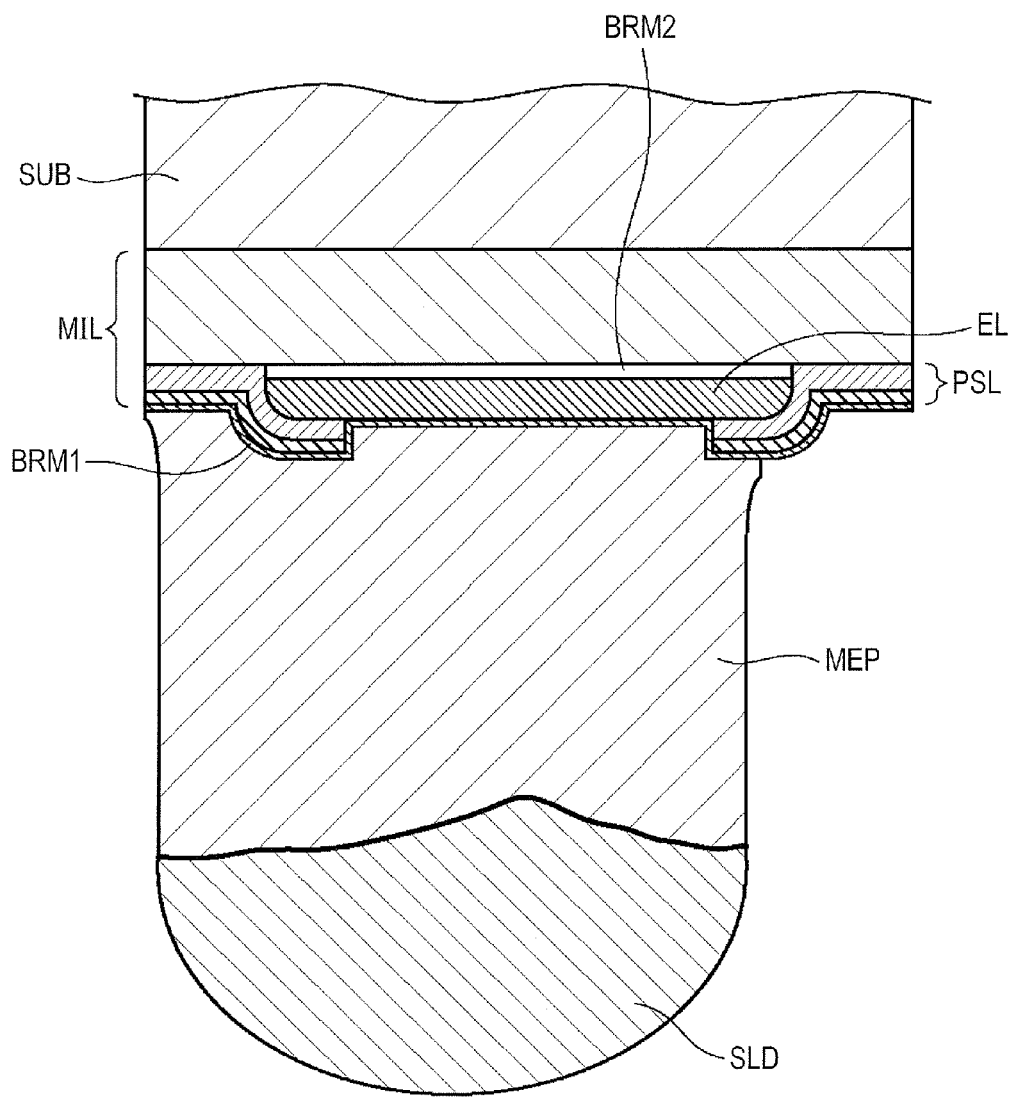
FIG. 17 is a sectional view showing the constitution of the semiconductor chip of a semiconductor device according to modification 2.

FIG. 17 is a sectional view showing the constitution of the semiconductor chip SC of a semiconductor device according to modification 2. The semiconductor chip SC shown in this figure has the same constitution as that of the semiconductor chip SC according to modification 1 except that it does not have the insulating layer SR1. In this modification, when the position of the conductor post MEP is to be determined, an opening formed in the protective insulating film PSL corresponds to the opening OP in modification 1.

The same effect as that of the semiconductor device SD according to the above embodiment can be obtained by this modification as well.

(Modification 3)

Figure 18:
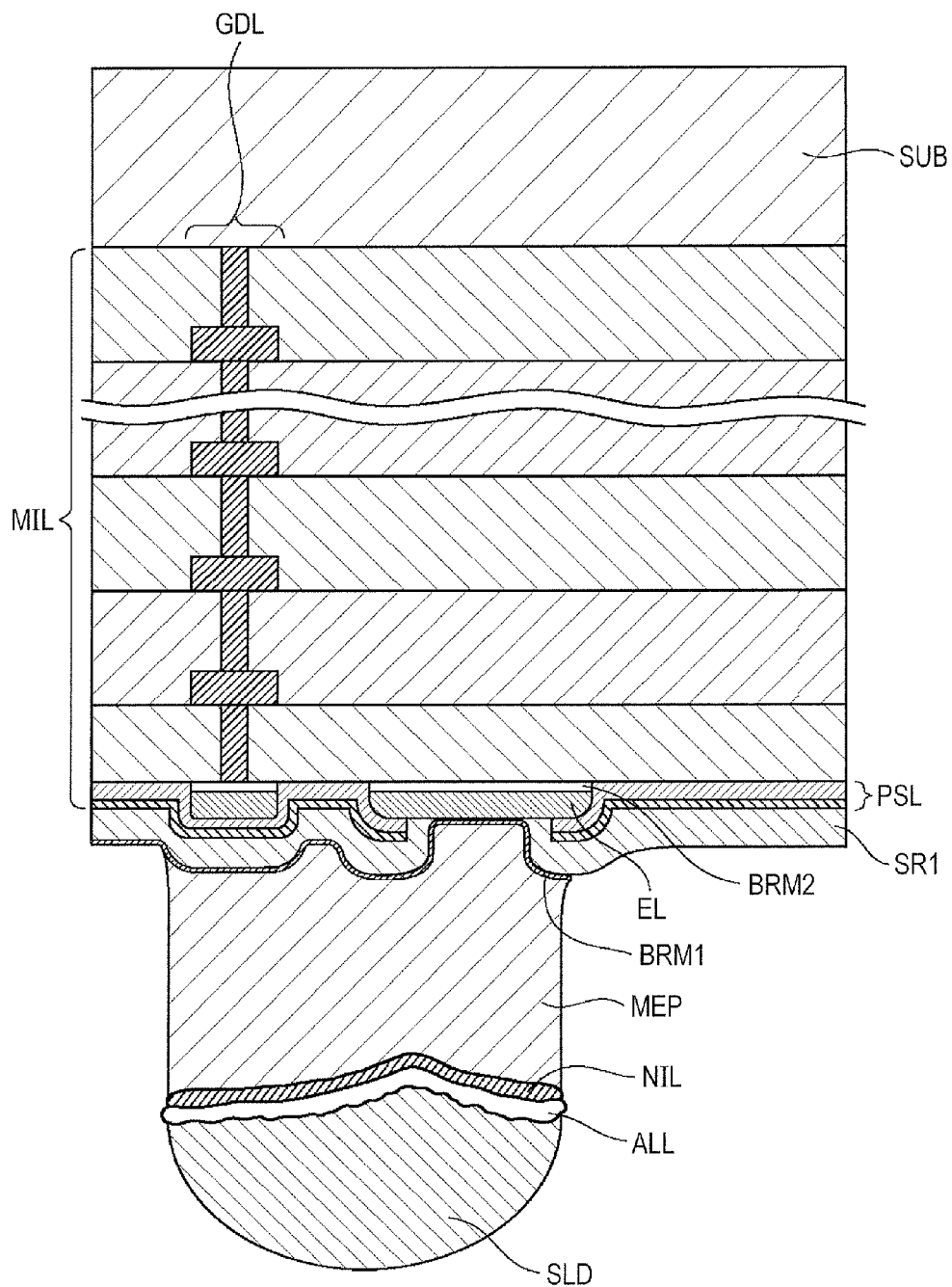
FIG. 18 is a sectional view showing the constitution of the semiconductor chip of a semiconductor device according to modification 3.

FIG. 18 is a sectional view showing the constitution of the semiconductor chip SC of a semiconductor device according to modification 3. The semiconductor chip SC shown in this figure has the same constitution as that of the semiconductor device according to any one of the above embodiment and modifications 1 and 2 except that at least part of the conductor post MEP overlaps with the guard ring GDL, of the semiconductor chip SC in the plan view.

The same effect as that of the semiconductor device SD according to the above embodiment can be obtained by this modification as well.

(Modification 4)

A semiconductor device SD according to this modification is identical to any one of the above embodiment and the modifications 1 to 3 except for the relative positions of the openings OP and the conductor posts MEP in the first region AR1 of the semiconductor chip SC.

Figure 19A:
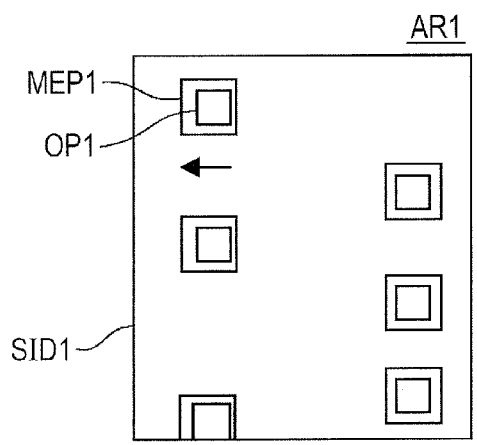
FIGS. 19A to 19E are sectional views showing modifications of the relative positions of the openings and the conductor posts in the first region of the semiconductor chip.

In the example shown in FIG. 19A, the first conductor post MEP1 shifts from the first opening OP1 in a direction parallel to the second side SID2. The same can be said of the conductor posts MEP other than the first conductor post MEP1. Stated more specifically, the conductor posts MEP situated at the outermost periphery out of the conductor posts MEP arranged along the first side SID1 shift from the openings OP in a direction parallel to the second side SID2. The shifting width may be larger as the conductor post MEP becomes closer to the end of the first side SID1.

Figure 19B:
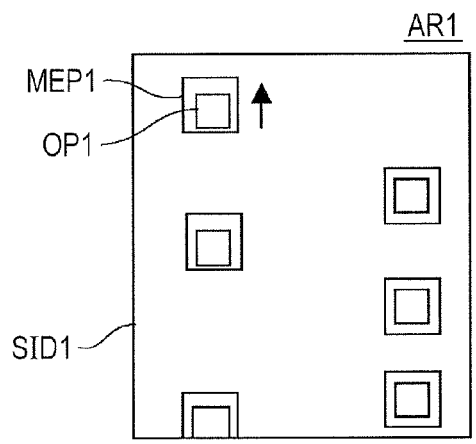

In the example shown in FIG. 19B, the first conductor post MEP1 shifts from the first opening OP1 in a direction parallel to the first side SID1. The same can be said of the conductor posts MEP other than the first conductor post MEP1. Stated more specifically, the conductor posts MEP situated at the outermost periphery out of the conductor posts MEP arranged along the first side SID1 shift from the openings OP in a direction parallel to the first side SID1. The shifting width may be larger as the conductor post MEP becomes closer to the end of the first side SID1.

Figure 19C:
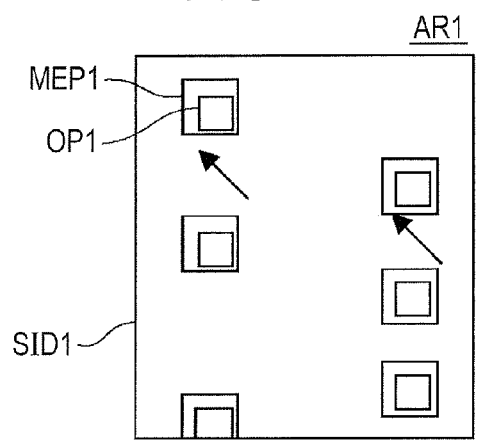

In the example shown in FIG. 19C, not only the conductor posts MEP situated at the outermost periphery but also the conductor posts MEP situated on the inner side of the row thereof shift in the same direction as that of the above embodiment.

Figure 19D:
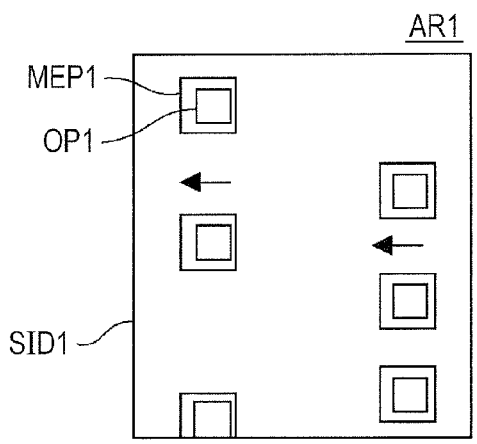

In the example shown in FIG. 19D, not only the conductor posts MEP situated at the outermost periphery but also the conductor posts MEP situated on the inner side of the row thereof shift in the same direction as that shown in FIG. 19A.

Figure 19E:
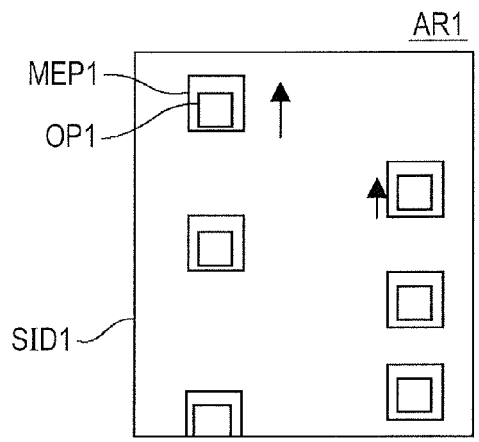

In the example shown in FIG. 19E, not only the conductor posts MEP situated at the outermost periphery but also the conductor posts MEP situated on the inner side of the row thereof shift in the same direction as that shown in FIG. 19B.

In FIGS. 19C to 19E, the shifting amount of each of the conductor posts MEP in the second row from the external side is smaller than the shifting amount of each of the conductor posts MEP situated at the outermost periphery. These shifting amounts may be the same.

The same effect as that of the above embodiment can be obtained by this modification as well.

(Modification 5)

Figure 20:
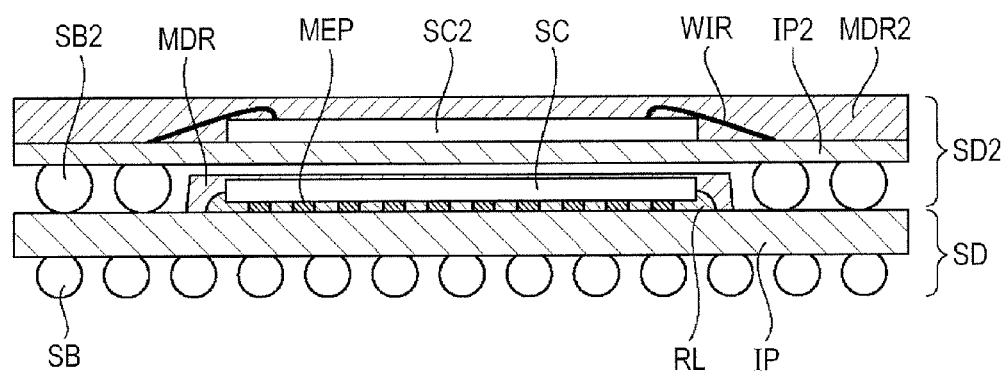
FIG. 20 is a sectional view showing a first example of an electronic apparatus having a semiconductor device.

FIG. 20 is a sectional view showing a first example of an electronic apparatus having the semiconductor device SD. This electronic apparatus has a so-called POP (Package on Package) structure that a semiconductor device SD2 is mounted over the semiconductor device SD.

Stated more specifically, the sealing resin MDR does not cover at least part of the peripheral part of the wiring board IP. Terminals for coupling the external terminals SB2 of the semiconductor device SD2 are provided in the part not covered with the sealing resin MDR of the first surface of the wiring board IP.

The semiconductor device SD2 has such constitution that a semiconductor chip SC2 is mounted over a wiring board IP2 and coupled to the wiring board IP2 by bonding wires WIR. The semiconductor chip SC2 and the bonding wires WIR are sealed with a sealing resin MDR2.

In the example shown in this figure, when the semiconductor device SD2 is mounted over the semiconductor device SD, heat is applied to the semiconductor device SD to melt the external terminals SB2. Stress is applied to the conductor posts MEP by this heat. In this modification, it is possible to prevent the conductor posts MEP from separating from the semiconductor chip SC by the function explained in the above embodiment.

Figure 21:
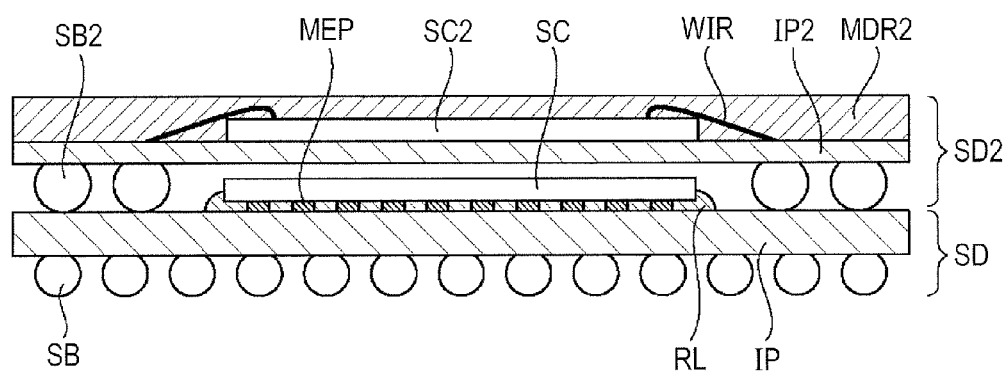
FIG. 21 is a sectional view showing a second example of an electronic, apparatus having a semiconductor device.

FIG. 21 is a sectional view showing a second example of an electronic apparatus having the semiconductor device SD. The example shown in this figure has the same structure as that of the example shown in FIG. 20 except that the semiconductor device SD does not have the sealing resin MDR.

Figure 22:
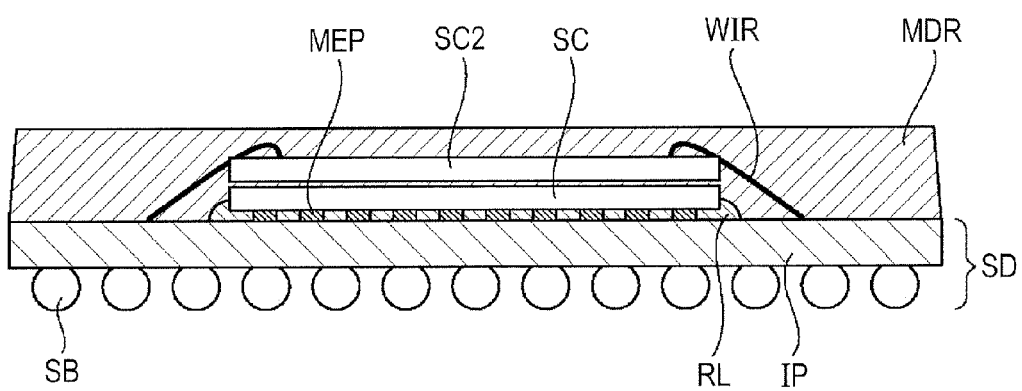
FIG. 22 is a sectional view showing a third example of an electronic apparatus having a semiconductor device.

FIG. 22 is a sectional view showing a third example of an electronic apparatus having the semiconductor device SD. In this figure, the semiconductor device SD has a so-called COC (Chip on Chip) structure that it has a semiconductor chip SC2 over the semiconductor chip SC. The semiconductor chip SC2 and the wiring board IP are coupled to each other by bonding wires WIR. The semiconductor chip SC, the semiconductor chip 302 and the bonding wires WIR are sealed with the sealing resin MDR.

Figure 23:
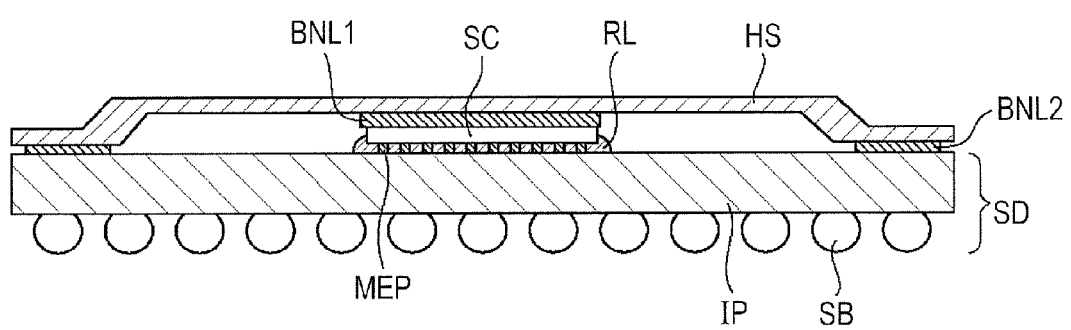
FIG. 23 is a sectional view showing a fourth example of an electronic apparatus having a semiconductor device.

FIG. 23 is a sectional view showing a fourth example of an electronic apparatus having the semiconductor device SD. In this modification, a metallic body HS is mounted over the semiconductor chip SC via a resin layer BNL1. The periphery of the metallic body HS is bent toward the wiring board IP and coupled to the wiring board IP via a resin layer BNL2. That is, in this example, heat generated by the semiconductor chip SC is released to other parts via the metallic body HS.

Figure 24:
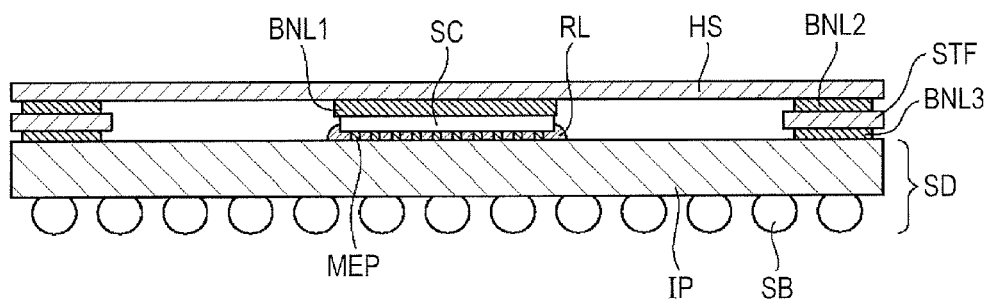
FIG. 24 is a sectional view showing a fifth example of an electronic apparatus having a semiconductor device.

FIG. 24 is a sectional view showing a fifth example of an electronic apparatus having the semiconductor device SD. The electronic apparatus according to this modification has the same constitution as that of the electronic apparatus shown in FIG. 23 except for the following points. First, the metallic body HS is a flat plate. The periphery of the metallic body HS is coupled to the wiring board IF via the resin layer BNL2, a ring metal plate STF (for example, a stiffener) and a resin layer BNL3.

Figure 25:
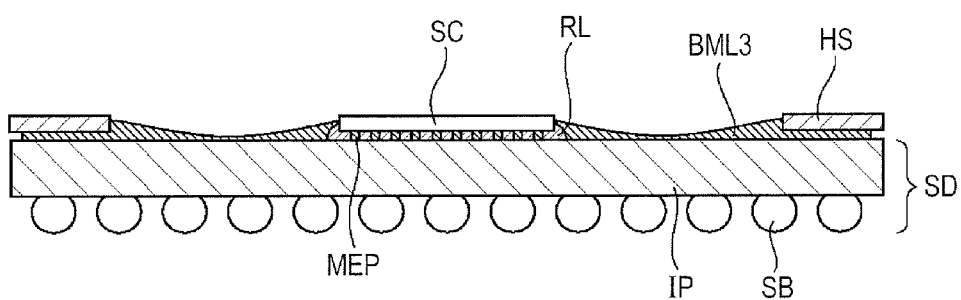
FIG. 25 is a sectional view showing a sixth example of an electronic apparatus having a semiconductor device.

FIG. 25 is a sectional view showing a sixth example of an electronic apparatus having the semiconductor device SD. The electronic apparatus according to this modification has the same constitution as that of the example shown in FIG. 24 except that it does not have the metallic body HS and the resin layer BNL2 and that the resin layer BNL is also formed between the metallic body HS and the semiconductor chip SC in the plan view.

Figure 26:
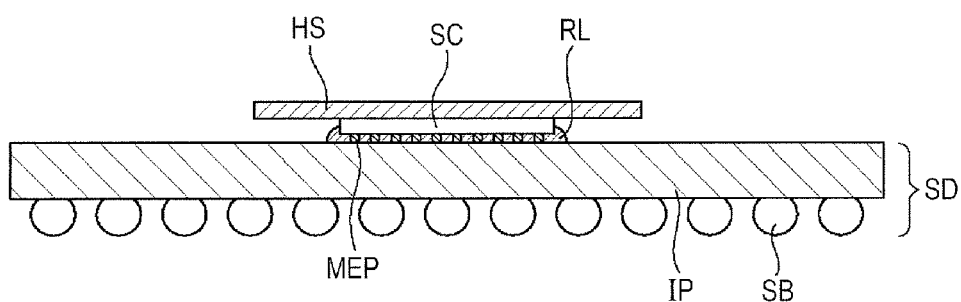
FIG. 26 is a sectional view showing a seventh example of an electronic apparatus having a semiconductor device.

FIG. 26 is a sectional view showing a seventh example of an electronic apparatus having the semiconductor device SD. The electronic apparatus according to this modification has the same constitution as that of the electronic apparatus shown in FIG. 23 except for the following points. First, the metallic body HS is a flat plate and mounted over the rear surface of the semiconductor chip SC. The periphery of the metallic body HS is not coupled to the wiring board IP.

Figure 27:
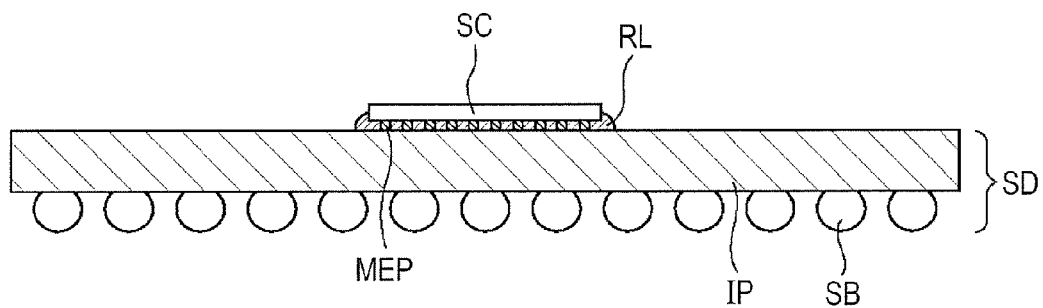
FIG. 27 is a sectional view showing an eighth example of an electronic apparatus having a semiconductor device.

FIG. 27 is a sectional view showing an eighth example of an electronic apparatus having the semiconductor device SD. The electronic apparatus according to this modification has the same constitution as that of the electronic apparatus shown in FIG. 23 except that it does not have the metallic body HS and the resin layers BNL1 and BNL2.

Figure 28:
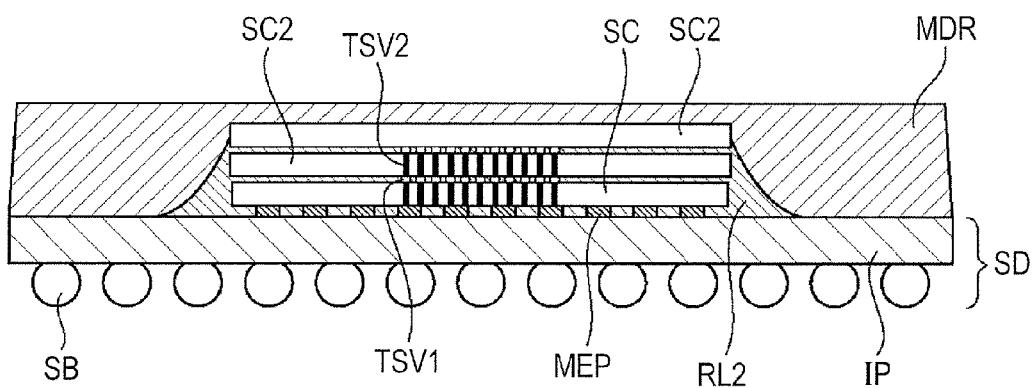
FIG. 28 is a sectional view showing the semiconductor device of an electronic apparatus according to a ninth example.

FIG. 28 is a sectional view showing a ninth example of an electronic apparatus having the semiconductor device SD. The semiconductor device SD of the electronic apparatus according to this modification has the same constitution as that of the semiconductor device SD according to the above embodiment except that at least one semiconductor chip SC2 is formed over the semiconductor chip SC.

Stated more specifically, the side surfaces of the semiconductor chip SC2 are sealed with a sealing material RL2. Through electrodes TSV1 are formed in the semiconductor chip SC and through electrodes TSV2 are formed in the semiconductor chip SC2. The semiconductor chip SC2 is coupled to the semiconductor chip SC via the through electrodes TSV2. In the example shown in this figure, in the plan view, the through electrodes TSV2 align with the respective through electrodes TSV1. The semiconductor chip SC2 is, for example, a memory chip, and the semiconductor chip SC is a logic chip.

The first to third examples are portable electronic apparatuses such as portable communication terminals and portable game equipment. The fourth to ninth examples are image reproduction equipment such as navigation equipment and TVs.

The same effect as that of the above embodiment can be obtained by these modifications as well.

While the invention made by the inventors of the present invention has been particularly described with reference to its preferred embodiment, it is to be understood that the invention is not limited thereto and that changes and variations may be made without departing from the spirit and scope of the invention.

What is claimed is:

1. A semiconductor device comprising:
a wiring board having a plurality of electrodes, and
a semiconductor chip which is mounted over the wiring board and coupled to the electrodes via solder,
wherein the semiconductor chip includes a rectangular substrate, an insulating film which is formed over the substrate, a plurality of openings which are formed in the insulating film and arranged along a first side of the substrate, a plurality of electrode pads which are situated in the respective openings, and conductor posts which are formed over the respective electrode pads and coupled to the solder and at least part of the periphery of each of which is situated over the insulating film;
wherein when a region where each of the conductor posts is overlapped with the insulating film is designated as an overlapped region, a first width which is the width of the overlapped region situated on a first straight line extending from the center of a first conductor post closest to one end of the first side of the substrate as a starting point to the center of the substrate as an end point is smaller than a second width which is the width of the overlapped region on an extension line extending in a direction passing through the center of the first conductor post of the first straight line toward the external side of the substrate, and
wherein a second straight line passing through the center of the first conductor post and the center of a first opening overlapped with the first conductor post and the first side intersect with each other at an angle other than 90°.

2. The semiconductor device according to claim 1, wherein the center of the first conductor post is farther away from the center of the substrate than the center of the first opening.

3. The semiconductor device according to claim 1, wherein the center of a second conductor post closest to the center of the first side is farther away from the center of the substrate than the center of a second opening overlapped with the second conductor post, and
the angle formed by a third straight line passing through the center of the second conductor post and the center of the second opening and the first side is 90° or closet to 90° than the angle formed by the second straight line and the first side.

4. The semiconductor device according to claim 1, wherein the average value of the arrangement pitch of the conductor posts is larger than the average value of the arrangement pitch of the openings.

5. The semiconductor device according to claim 1, wherein the average value of the arrangement pitch of the conductor posts in ⅓ on the one end side of the first side is larger than the average value of the arrangement pitch of the conductor posts in the next ⅓ of the first side.

6. The semiconductor device according to claim 1, wherein the electrode pads, the openings and the conductor posts are arranged in at least two rows along the first side, and the second width of the first conductor post in the outer one of the two rows is larger than the second width of the first conductor post in the inner one of the two rows.

7. The semiconductor device according to claim 1, wherein the electrode pads, the openings and the conductor posts are arranged in at least two rows along the first side, and
the centers of the conductor posts in the inner one of the two rows almost align with the centers of the openings overlapped with the conductor posts.

* * * * *